United States Patent
Lee et al.

(10) Patent No.: US 11,254,093 B2
(45) Date of Patent: Feb. 22, 2022

(54) LINER AND DISPLAY DEVICE INCLUDING THE SAME

(71) Applicant: Samsung Display Co., Ltd., Yongin-si (KR)

(72) Inventors: Cheol Ho Lee, Hwaseong-si (KR); Wi Jin Nam, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 84 days.

(21) Appl. No.: 16/597,513

(22) Filed: Oct. 9, 2019

(65) Prior Publication Data

US 2020/0254721 A1 Aug. 13, 2020

(30) Foreign Application Priority Data

Feb. 12, 2019 (KR) ........................ 10-2019-0016298

(51) Int. Cl.
*H05K 9/00* (2006.01)
*B32B 7/022* (2019.01)
(Continued)

(52) U.S. Cl.
CPC ............... *B32B 7/022* (2019.01); *B32B 7/12* (2013.01); *C09J 7/20* (2018.01); *H05K 1/0266* (2013.01);
(Continued)

(58) Field of Classification Search
CPC ..... B32B 7/022; B32B 7/12; B32B 2457/208; B32B 17/06; B32B 2457/20; B32B 2307/554; B32B 2307/7145; B32B 2270/00; B32B 2266/0242; B32B 2307/558; B32B 2307/42; B32B 2307/546; B32B 2266/0278; B32B 2307/7265; B32B 2307/41; B32B 27/308; B32B 15/08; B32B 27/286; B32B 27/28; B32B 27/285; B32B 5/32; B32B 23/08; B32B 9/041; B32B 19/04; B32B 27/32; B32B 27/281; B32B 27/40; B32B 27/06; B32B 27/365; B32B 9/046; B32B 3/266; B32B 27/36; B32B 15/20; B32B 9/045; B32B 23/04; B32B 15/043; B32B 27/08; B32B 2457/206; B32B 2307/51; B32B 2307/212;
(Continued)

(56) References Cited

U.S. PATENT DOCUMENTS

| | | | | |
|---|---|---|---|---|
| 6,641,910 B1 * | 11/2003 | Bries | ........................... | C09J 7/20 428/343 |
| 2013/0120957 A1 * | 5/2013 | Werner | ................... | H05K 3/225 361/818 |

(Continued)

FOREIGN PATENT DOCUMENTS

KR 10-2018-0085399 A 7/2018

*Primary Examiner* — Steven T Sawyer
(74) *Attorney, Agent, or Firm* — Lewis Roca Rothgerber Christie LLP

(57) ABSTRACT

Provided are a liner and a display device including the same. The liner includes a first liner including a first shield can protection portion, a first grip portion, and a connection portion coupling the first shield can protection portion to the first grip portion, a second liner including a second shield can protection portion and a second grip portion, and a perforated line formed along a boundary between the first liner and the second shield can protection portion.

15 Claims, 16 Drawing Sheets

(51) Int. Cl.
*B32B 7/12* (2006.01)
*H05K 1/18* (2006.01)
*H05K 1/02* (2006.01)
*H05K 5/02* (2006.01)
*C09J 7/20* (2018.01)

(52) U.S. Cl.
CPC .......... *H05K 1/181* (2013.01); *H05K 5/0252* (2013.01); *H05K 9/0024* (2013.01); *H05K 9/0026* (2013.01); *H05K 9/0028* (2013.01); *H05K 9/0054* (2013.01); *B32B 2457/208* (2013.01); *C09J 2301/16* (2020.08); *C09J 2301/18* (2020.08); *H05K 2201/09936* (2013.01); *H05K 2201/10128* (2013.01); *H05K 2201/10371* (2013.01)

(58) Field of Classification Search
CPC ........ B32B 2266/0207; B32B 2307/71; B32B 9/007; B32B 3/08; B32B 5/18; B32B 2307/748; C09J 7/20; C09J 2301/18; C09J 2301/16; H05K 5/0252; H05K 9/0054; H05K 9/0026; H05K 9/0028; H05K 9/0024; H05K 1/0266; H05K 1/181; H05K 2201/09936; H05K 2201/10128; H05K 2201/10371; H05K 3/281; H05K 2203/1383; H04M 1/026; G06K 1/12

See application file for complete search history.

(56) References Cited

U.S. PATENT DOCUMENTS

| | | | |
|---|---|---|---|
| 2014/0307392 A1* | 10/2014 | Kurz | H01L 23/552 361/720 |
| 2015/0064386 A1* | 3/2015 | Mag | G06F 1/1613 428/41.8 |
| 2016/0284665 A1* | 9/2016 | Yang | H01L 23/544 |

* cited by examiner

LINER AND DISPLAY DEVICE INCLUDING THE SAME

CROSS-REFERENCE TO RELATED APPLICATION

This application claims priority to and the benefit of Korean Patent Application No. 10-2019-0016298, filed on Feb. 12, 2019, which is hereby incorporated by reference for all purposes as if fully set forth herein.

BACKGROUND

1. Field

Embodiments of the present disclosure relate to a liner and a display device including the same.

2. Description of the Related Art

Importance of display devices is increasing along with the development of multimedia. Accordingly, various kinds of display devices, such as liquid crystal displays ("LCDs") and organic light-emitting displays ("OLEDs"), are being used.

Various integrated circuits of such display devices are factors which determine performance of the display device. As the performance of the integrated circuits becomes higher, the integrated circuits consume a large amount of power. Accordingly, a heat generation problem may occur, or a high frequency electromagnetic wave may be generated in the integrated circuits. In order to prevent or reduce such problems, when the integrated circuit is mounted on a printed circuit board, a shield can or the like covering the integrated circuit may be provided.

The shield can may be scratched or crushed by an external factor during transport or an assembly process thereof. To prevent or reduce such a problem, a liner may be attached to a surface of the shield can to protect the shield can. On the other hand, a barcode or the like including pieces of information on an integrated circuit and a display device may be marked on the shield can. There is a need for a liner which concurrently (e.g., simultaneously) satisfies purposes of protecting a surface of a shield can and making marking information accessible for operator convenience.

SUMMARY

Aspects of embodiments of the present disclosure provide liners capable of concurrently (e.g., simultaneously) performing purposes of protecting a shield can and providing information relating to an electronic device by sequentially separating the liners according to process operations, and a display device including the same.

According to an embodiment of the present disclosure, a liner includes a first liner including a first shield can protection portion, a first grip portion, and a connection portion coupling the first shield can protection portion to the first grip portion, a second liner including a second shield can protection portion and a second grip portion, and a perforated line formed along a boundary between the first liner and the second shield can protection portion.

The first shield can protection portion, the connection portion, and the second shield can protection portion may overlap a shield can surrounding at least one integrated circuit.

The first shield can protection portion may overlap a central region of the shield can, and the second shield can protection portion overlaps an edge region of the shield can.

The first liner and the second liner may include a film layer and an adhesive layer that attaches (e.g., adheres) the film layer to the shield can.

The first shield can protection portion and the second shield can protection portion may include the adhesive layer in at least a region of the first shield can protection portion and the second shield can protection portion.

The perforated line may be formed by punching the film layer so as to be partially perforated along a corresponding position thereof.

The perforated line may be formed by punching the film layer and the adhesive layer so as to be partially perforated along a corresponding position thereof.

A distance from an upper surface of a circuit board, on which the integrated circuit is mounted, to an upper surface of the film layer may be greater than a distance from the upper surface of the circuit board to an upper surface of the shield can.

The first shield can protection portion may include an information marking relating to the integrated circuit.

The information marking may be any one selected from a numeral, a character, a bar code, and a quick response (QR) code.

The shield can may have a rectangular shape when viewed from above.

The connection portion may be formed to overlap a corner of the shield can.

The first grip portion may have a width equal to a lateral length of the shield can and extends in a first direction of the shield can.

The second grip portion may have a width equal to a vertical length of the shield can and extends in a second direction perpendicular (e.g., substantially perpendicular) to a first direction.

The second grip portion may have a width equal to a lateral length of the shield can and extends in a third direction opposite to a first direction.

A pull tab portion may further provided at a region of an upper end of the first grip portion and a region of an upper end of the second grip portion.

According to an embodiment of the present disclosure, a method of manufacturing a display device, the method includes: providing a circuit board on which at least one integrated circuit is mounted; providing a shield can surrounding the integrated circuit; attaching a liner including a first liner and a second liner to an upper surface of the shield can; marking an information marking relating to the integrated circuit on the first liner;

coupling the circuit board to a display panel; removing the first liner; marking the information marking on an upper surface of the shield can from which the first liner is removed; coupling the display panel to a display device; and removing the second liner.

The first liner and the second liner may include a film layer and an adhesive layer that attaches the film layer to the shield can.

A distance from an upper surface of the circuit board to an upper surface of the film layer may be greater than a distance from the upper surface of the circuit board to an upper surface of the shield can.

According to an embodiment of the present disclosure, a display device includes a circuit board, an integrated circuit mounted on the circuit board, a shield can formed to surround the integrated circuit, and a liner attached to the shield can, the liner being configured to be peeled off.

The liner includes a first liner including a first shield can protection portion, a first grip portion, and a connection portion coupling the first shield can protection portion to the first grip portion, a second liner including a second shield can protection portion and a second grip portion, and a perforated line formed along a boundary between the first liner and the second shield can protection portion.

It should be noted that features of the present disclosure are not limited to the above-described features, and other features of the present disclosure will be apparent to those skilled in the art from the following descriptions.

BRIEF DESCRIPTION OF THE DRAWINGS

The above and other features of embodiments of the present disclosure will become more apparent by describing exemplary embodiments thereof in more detail with reference to the attached drawings, in which.

DETAILED DESCRIPTION

Figure 1:
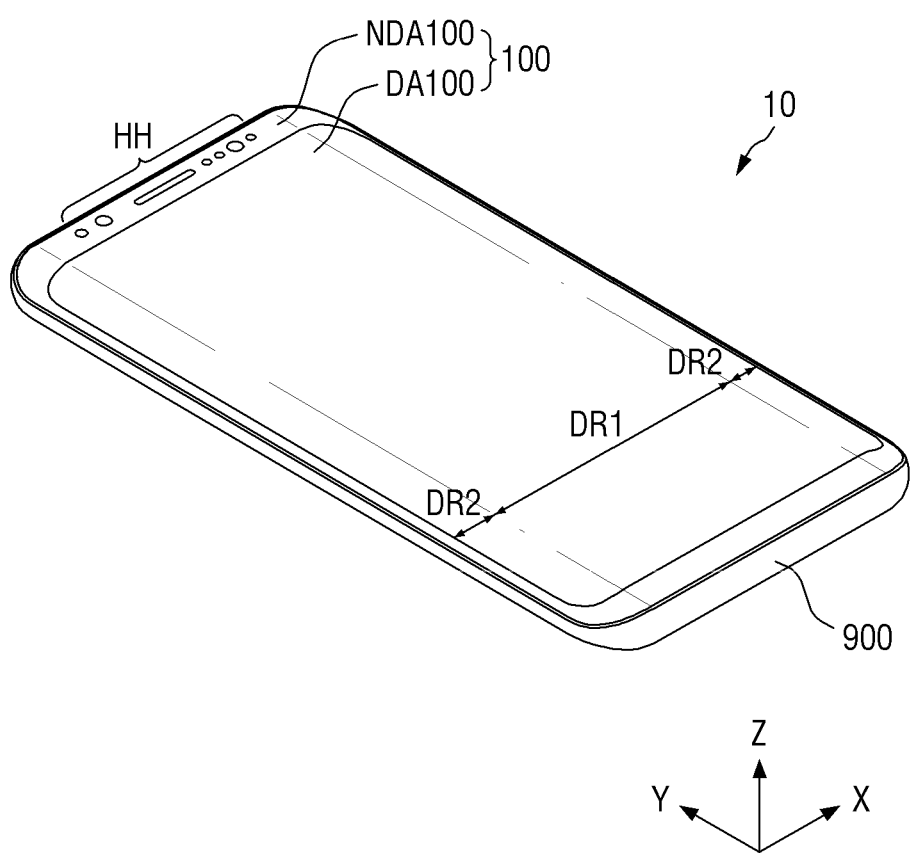
FIG. 1 is a perspective view illustrating a display device according to an exemplary embodiment.

Features of the present disclosure, and methods for achieving the features, will be apparent by referring to the embodiments to be described in more detail with reference to the accompanying drawings. However, the subject matter of the present disclosure is not limited to the embodiments disclosed hereinafter, but can be implemented in diverse forms. The matters described in the description, such as construction and elements, are merely details provided to assist those of ordinary skill in the art in a comprehensive understanding of the subject matter of the present disclosure, and the scope of the present disclosure is only defined by the appended claims, and equivalents thereof.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween. In the present description, the same drawing reference numerals are used for the same elements across various figures.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The use of the terms "a," "an," "the," and similar terms in the context of describing the subject matter of the present disclosure (especially in the context of the following claims) are to be construed to cover both the singular and the plural, unless otherwise indicated herein or clearly contradicted by context. The terms "comprising," "having," "including," and "containing" are to be construed as open-ended terms (e.g., meaning "including, but not limited to,") unless otherwise noted.

Hereinafter, embodiments of the present disclosure will be described with reference to the attached drawings.

Figure 2:
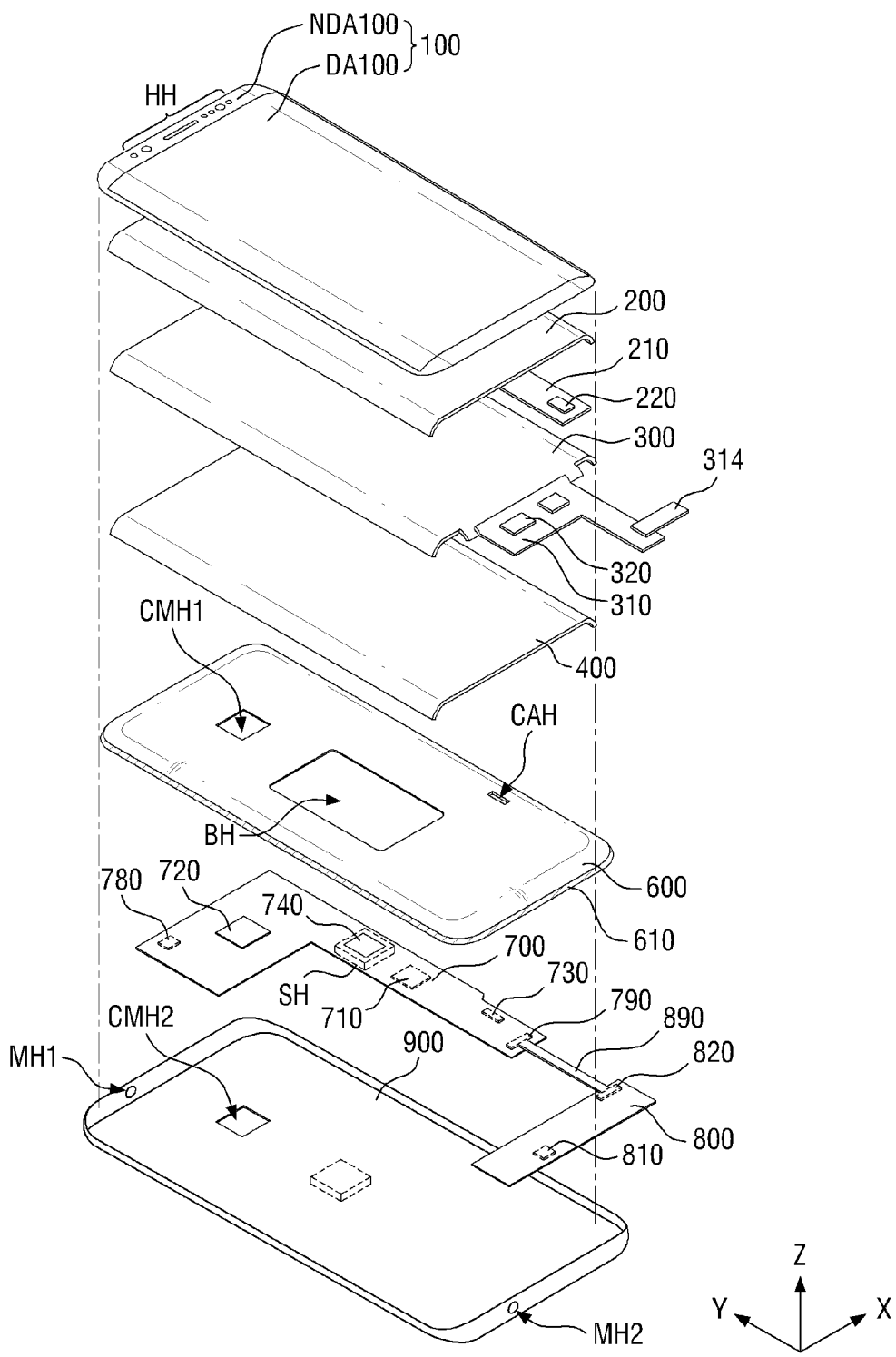
FIG. 2 is an exploded perspective view illustrating the display device according to the exemplary embodiment.

FIG. 1 is a perspective view illustrating a display device according to an exemplary embodiment. FIG. 2 is an exploded perspective view illustrating the display device according to the exemplary embodiment.

Referring to FIGS. 1 and 2, a display device 10 according to the exemplary embodiment includes a cover window 100, a touch sensing device 200, a touch circuit board 210, a touch driver 220, a display panel 300, a display circuit board 310, a display driver 320, a panel lower member 400, a sound generator 510, a middle frame 600, a main circuit board 700, an auxiliary circuit board 800, and a lower cover 900.

In the present specification, the terms "upper portion," "top," and "upper surface" refer to a direction in which the cover window 100 is located with respect to the display panel 30, that is, a Z-axis direction, and the terms "lower portion," "bottom," and "lower surface" refer to a direction in which the middle frame 600 is located with respect to the display panel 300, that is, a direction opposite to the Z-axis direction. In addition, the terms "left," "right," "upper," and "lower" refer to a direction when the display panel 300 is viewed from above. For example, the term "right" refers to an X-axis direction, the term "left" refers to a direction opposite to the X-axis direction, the term "upper" refers to the Z-axis direction, and the term "lower" refers to the opposite direction to the Z-axis direction.

The display device 10 may be formed in a rectangular shape (e.g., a substantially rectangular shape) when viewed from above. For example, as shown in FIGS. 1 and 2, a top view of the display device 10 may show a rectangular shape which has a short side in a first direction (X-axis direction) and a long side in a second direction (Y-axis direction). A corner at which the short side in the first direction (X-axis direction) meets the long side in the second direction (Y-axis direction) may be rounded or formed at a right angle to have a certain curvature. The shape of the top view of the display device 10 is not limited to the rectangular shape but may be formed in another polygonal shape, circular shape, or elliptical shape.

The display device 10 may include a first region DR1 formed to be flat and second regions DR2 extending from left and right sides of the first region DR1. The second region DR2 may be formed to be flat or have a curved shape. When the second region DR2 is formed to be flat, an angle formed by the first region DR1 and the second region DR2 may be an obtuse angle. When the second region DR2 is formed to have the curved surface, the second region DR2 may have a constant curvature or a variable curvature.

The second regions DR2 are illustrated in FIG. 1 as extending from the left and right sides of the first region DR1, but the present disclosure is not limited thereto. That is, the second region DR2 may extend only from one side selected from the left and right sides of the first region DR1. In some embodiments, the second region DR2 may extend from at least one selected from the left and right sides as well as upper and lower sides of the first region DR1. Hereinafter, it will be mainly described that the second regions DR2 are at left and right edges of the display device 10.

The cover window 100 may be on an upper portion of the display panel 300 to cover an upper surface of the display panel 300. Therefore, the cover window 100 may function to protect the upper surface of the display panel 300. The cover window 100 may be attached to (e.g., adhered to) the touch sensing device 200 through an adhesive member. The adhesive member may be an optically clear adhesive film (OCA) or an optically clear resin (OCR).

The cover window 100 may include a light transmitting portion DA100 corresponding to the display panel 300 and a light blocking portion NDA100 corresponding to a region excluding the display panel 300. The cover window 100 may be in the first region DR1 and the second regions DR2. The light transmitting portion DA100 may be in a portion of the first region DR1 and a portion of each of the second regions DR2. The light blocking portion NDA100 may be formed to be opaque. In some embodiments, the light blocking portion NDA100 may be formed as a decor layer having a pattern which is visible to a user when an image is not displayed. For example, a company logo or various suitable characters may be patterned on the light blocking portion NDA100. In addition, the blocking portion NDA100 may have holes HH for exposing a front camera, an iris recognition sensor, an illumination sensor, and the like, but the present disclosure is not limited thereto. For example, some or all of the front camera, the iris recognition sensor, and the illumination sensor may be embedded in the display panel 300. In this case, some or all of the holes HH may be deleted.

The cover window 100 may be made of glass, sapphire, and/or plastic. The cover window 100 may be formed to be rigid or flexible.

The touch sensing device 200 may be between the cover window 100 and the display panel 300. The touch sensing device 200 may be in the first region DR1 and the second regions DR2. Therefore, a touch of the user may be sensed not only in the first region DR1 but also in the second regions DR2.

The touch sensing device 200 may be attached to (e.g., adhered to) a lower surface of the cover window 100 through an adhesive member. A polarizing film may be added to prevent or reduce a decrease in visibility caused by external light reflection on the touch sensing device 200. In this case, the polarizing film may be attached to (e.g., adhered to) the lower surface of the cover window 100 through an adhesive member.

The touch sensing device 200 may be a device configured to sense a touch position of a user and may be implemented as a capacitance type (or kind) such as a self-capacitance type (or kind) or a mutual capacitance type (or kind). When the touch sensing device 200 is implemented as the self-capacitance type (or kind), the touch sensing device 200 may include only touch driving electrodes. When the touch sensing device 200 is implemented as the mutual capacitance type (or kind), the touch sensing device 200 may include touch driving electrodes and touch sensing electrodes. Hereinafter, it will be mainly described that the touch sensing device is implemented as the mutual capacitance type (or kind).

The touch sensing device 200 may be formed in a panel form or a film form. In this case, the touch sensing device 200 may be attached on (e.g., adhered on) a thin encapsulation film of the display panel 300 through an adhesive member. The adhesive member may be an OCA or an OCR.

In some embodiments, the touch sensing device 200 may be integrally formed with the display panel 300. In this case, the touch driving electrodes and the touch sensing electrodes of the touch sensing device 200 may be formed on the thin encapsulation film of the display panel 300 or an encapsulation substrate or film which covers a light-emitting element layer of the display panel 300.

The touch circuit board 210 may be attached to (e.g., adhered to) a side of the touch sensing device 200. For example, an end of the touch circuit board 210 may be attached on (e.g., adhered on) pads provided on a side of the touch sensing device 200 using an anisotropic conductive film. In addition, a touch connection portion may be provided at the other end of the touch circuit board 210 and may be coupled to a touch connector 312a of the display circuit board 310. The touch circuit board may be a flexible printed circuit board.

The touch driver 220 may apply touch driving signals to the touch driving electrodes of the touch sensing device 200, may sense sensing signals from the touch sensing electrodes of the touch sensing device 200, and may analyze the sensing signals to calculate a touch position of a user. The touch driver 220 may be formed as an integrated circuit (IC) and may be mounted on the touch circuit board 210.

The display panel 300 may be under the touch sensing device 200. The display panel 300 may overlap the light transmitting portion 100DA of the cover window 100. The display panel 300 may be in the first region DR1 and the second regions DR2. Therefore, an image of the display panel 300 may be displayed not only in the first region DR1 but also in the second regions DR2.

The display panel 300 may be a light-emitting display panel including a light-emitting element. For example, the display panel 300 may include an organic light-emitting display panel using an organic light-emitting diode, a micro light-emitting diode (LED) display panel using a micro LED, and a quantum dot LED display panel including a quantum dot LED.

The display panel 300 may include a substrate, a thin film transistor layer on the substrate, a light-emitting element layer, and a thin film encapsulation layer.

The display panel 300 may be flexible and thus may be formed of plastic. In this case, the substrate may include a flexible substrate and a support substrate. Since the support substrate is for supporting the flexible substrate, flexibility thereof may be less than that of the flexible substrate. Each of the flexible substrate and the support substrate may include a flexible polymeric material. For example, each of the flexible substrate and the support substrate may include one selected from among polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and combinations thereof.

The thin film transistor layer is on the substrate. The thin film transistor layer may include scan lines, data lines, and thin film transistors. Each of the thin film transistors includes a gate electrode, a semiconductor layer, and source and drain electrodes. When a scan driver is formed directly on the substrate, the scan driver may be formed together with the thin film transistor layer.

A light-emitting element layer is on the thin film transistor layer. The light-emitting element layer includes anodes, a light-emitting layer, a cathode, and banks. The light-emitting layer may include an organic light-emitting layer including an organic material. For example, the light-emitting layer may include a hole injection layer, a hole transporting layer, an organic light-emitting layer, an electron transporting layer, and an electron injection layer. The hole injection layer and the electron injection layer may be omitted. When a voltage is applied to the anode and the cathode, holes and electrons are moved to the organic light-emitting layer through the hole transporting layer and the electron transporting layer and are coupled to each other in the organic light-emitting layer to emit light. The light-emitting element layer may be a pixel array layer in which pixels are formed. Thus, a region in which the light-emitting element layer is formed may be defined as a display region for displaying an image. A peripheral region of the display region may be defined as a non-display region.

The thin film encapsulation layer is on the light-emitting element layer. The thin film encapsulation layer functions to prevent or reduce permeation of oxygen or moisture into the light-emitting element layer. The thin film encapsulation layer may include at least one inorganic film and at least one organic film.

The display circuit board 310 may be attached to (e.g., adhered to) a side of the display panel 300. For example, an end of the display circuit board 310 may be attached on (e.g., adhered on) pads provided on a side of the display panel 300 using an anisotropic conductive film. The display circuit board 310 may be bent toward a lower surface of the display panel 300. The touch circuit board 210 may also be bent toward the lower surface of the display panel 300. Accordingly, the touch connection portion provided at the other end of the touch circuit board 210 may be coupled to the touch connector 312a of the display circuit board 310. The display circuit board 310 will be described in more detail below with reference to FIGS. 3 to 5.

The display driver 320 outputs signals and voltages for driving the display panel 300 through the display circuit board 310. The display driver 320 may be formed as an IC and may be mounted on the display circuit board 310, but the present disclosure is not limited thereto. For example, the display driver 320 may be attached directly on the substrate of the display panel 300. In this case, the display driver 320 may be attached to (e.g., adhered to) an upper or lower surface of the substrate of the display panel 300.

The panel lower member 400 may be on a lower portion of the display panel 300. The panel lower member 400 may be attached to (e.g., adhered to) the lower surface of the display panel 300 through an adhesive member. The adhesive member may be an OCA or an OCR.

The panel lower member 400 may include a light absorption member configured to absorb light incident from the outside, a buffer member configured to absorb an impact from the outside, a heat dissipation member configured to efficiently dissipate heat from the display panel 300, and a light blocking layer configured to block light incident from the outside.

The light absorption member may be on the lower portion of the display panel 300. The light absorption member prevents or reduces transmission of light to prevent or reduce visibility of components below the light absorption member, e.g., the display circuit board 310 and the like, from the upper portion of the display panel 300. The light absorption member may include a light absorption material such as a black pigment or a dye.

The buffer member may be under the light absorption member. The buffer member absorbs an external impact to prevent or reduce damage to the display panel 300. The buffer member may include a single layer or a plurality of layers. For example, the buffer member may be made of a polymer resin such as polyurethane, polycarbonate, polypropylene, and/or polyethylene and/or may be made of a material having elasticity, such as a sponge formed by foam-molding rubber, a urethane-based material, and/or an acrylic-based material. The buffer member may be a cushioning layer.

The heat dissipation member may be under the buffer member. The heat dissipation member may include a first heat dissipation layer including graphite or carbon nanotubes and a second heat dissipation layer formed as a thin film of a metal such as copper, nickel, ferrite, and/or silver, which is capable of shielding an electromagnetic wave and has high heat conduction quality.

The middle frame 600 may be under the panel lower member 400. The middle frame 600 may include a synthetic resin, a metal, or both of the synthetic resin and the metal.

The middle frame 600 may have a first camera hole CMH1 into which a camera device 720 is inserted, a battery hole BH for dissipating heat of a battery, and a through-hole CAH through which a second connection cable 314 coupled to the display circuit board 310 passes.

A waterproofing member 610 may be on an edge of the middle frame 600. The waterproofing member 610 may be attached to (e.g., adhered to) an upper surface of the panel lower member 400 and a lower surface of the middle frame 600. Thus, the waterproofing member 610 may prevent or reduce permeation of water or dust between the display panel 300 and the middle frame 600. For example, it is possible for the display device 10 to waterproof (e.g., substantially waterproof) and/or dustproof (e.g., substantially dustproof).

In some embodiments, the waterproofing member 610 may include a base film, a first adhesive film on a surface of the base film, and a second adhesive film on the other surface of the base film. The base film may include PET, PET and a cushioning layer, and/or polyethylene foam (PE-foam). The first adhesive film and the second adhesive film may include a pressure sensitive adhesive (PSA). The first adhesive film may be attached to (e.g., adhered to) a lower surface of the panel lower member 400, and the second adhesive film may be attached to (e.g., adhered to) an upper surface of the middle frame 600.

The main circuit board 700 may be under the middle frame 600. The main circuit board 700 may be a printed circuit board or a flexible printed circuit board.

An embodiment of the main circuit board 700 includes a main processor 710, a shield can SH, the camera device 720, a main connector 730, a power management IC (PMIC) 740, a first microphone 780, and a first auxiliary connector 790. The main processor 710, the main connector 730, the first microphone 780, and the first auxiliary connector 790 may be on a lower surface of the main circuit board 700 which faces a lower cover 900. In addition, the camera device 720 may be on each of an upper surface and the lower surface of the main circuit board 700.

The main processor 710 may control all functions of the display device 10. For example, the main processor 710 may output image data to the display driver 320 of the display circuit board 310 such that the display panel 300 displays an image. In addition, the main processor 710 may receive touch data from the touch driver 220, may determine a touch position of a user, and then may execute an application indicated by an icon displayed at the touch position of the user. Furthermore, the main processor 710 may receive the touch data from the touch driver 220 and execute the application indicated by the icon displayed at the touch position of the user based on the touch data.

The main processor 710 may be an application processor, a central processing unit, or a system chip that is formed as an IC.

The PMIC 740 may be electrically coupled to the touch circuit board 210, the touch driver 220, the display circuit board 310, the display driver 320, and the main processor 710. The PMIC 740 may control power supplied to the touch circuit board 210, the touch driver 220, the display circuit board 310, the display driver 320, and the main processor 710. According to an exemplary embodiment, the PMIC 740 may control the power supplied to the display panel 300 while the display panel 300 is driven in a normal power mode. In the present document, the general power mode means a mode in which the display panel 300 is driven while the main processor 710 is in an awake state.

The camera device 720 processes an image frame of a still image, a moving image, or the like obtained by an image sensor in a camera mode and outputs the image frame to the main processor 710.

The second connection cable 314 passing through the through-hole CAH of the middle frame 600 may be coupled to the main connector 730. Thus, the main circuit board 700 may be electrically coupled to the display circuit board 310 and the touch circuit board 210.

The first microphone 780 may be at a side of the display device 10. The first microphone 780 may sense a sound wave and an ultrasonic wave. For example, the first microphone 780 may sense a sound wave having a frequency lower than 20 kHz and/or an ultrasonic wave having a frequency of 20 kHz to 50 kHz. Therefore, when the sound generator 510 vibrates the display panel 300 to output an ultrasonic wave in a proximity sensor mode, the ultrasonic wave reflected by an object may be sensed by the first microphone 780. The first microphone 780 may convert the sensed ultrasonic wave into a first electrical signal and output the converted first electrical signal to the main processor 710.

A third connection cable 890 coupled to the auxiliary circuit board 800 may be coupled to the first auxiliary connector 790. The main circuit board 700 and the auxiliary circuit board 800 may be electrically coupled through the third connection cable 890.

In addition, the main circuit board 700 may be further equipped with a mobile communication module capable of transmitting and receiving a wireless signal to and from at least one selected from a base station, an external terminal, and a server on a mobile communication network. The wireless signal may include various suitable types (or kinds) of data associated with transmission and/or reception of a voice signal, a video call signal, and/or a text/multimedia message.

The auxiliary circuit board 800 may include a second microphone 810 and a second auxiliary connector 820. The second microphone 810 and the second auxiliary connector 820 may be on a lower surface of the main circuit board 700 which faces the lower cover 900.

The second microphone 810 may be at a side opposite to a side of the display device 10 at which the first microphone 780 is located. The second microphone 810 may sense a sound wave and/or an ultrasonic wave. For example, the second microphone 810 may sense a sound wave having a frequency lower than 20 kHz and/or an ultrasonic wave having a frequency of 20 kHz to 50 kHz. Therefore, when the sound generator 510 vibrates the display panel 300 to output an ultrasonic wave in a proximity sensor mode, the ultrasonic wave reflected by an object may be sensed by the second microphone 810. The second microphone 810 may convert the sensed ultrasonic wave into a second electrical signal and output the converted second electrical signal to the main processor 710.

The main processor 710 may determine whether an object is positioned in close proximity to the display device 10 based on the first electrical signal of the first microphone 780 and the second electrical signal of the second microphone 810. The third connection cable 890 coupled to the main circuit board 700 may be coupled to the second auxiliary connector 820. The main circuit board 700 and the auxiliary circuit board 800 may be electrically coupled through the third connection cable 890.

The lower cover 900 may be below the middle frame 600 and the main circuit board 700. The lower cover 900 may be coupled and fixed to the middle frame 600. The lower cover 900 may form a lower exterior of the display device 10. The lower cover 900 may include plastic and/or a metal.

A first microphone hole MH1 may be formed in the lower cover 900 to correspond to a position at which the first microphone 780 is located so as to sense a sound wave and/or an ultrasonic wave from the outside. In addition, a second microphone hole MH2 may be formed in the lower cover 900 to correspond to a position at which the second microphone 810 is located so as to sense a sound wave and/or an ultrasonic wave from the outside.

In addition, a second camera hole CMH2, through which the camera device 720 is inserted to protrude to the outside, may be formed in the lower cover 900. A position of the camera device 720 and positions of the first camera hole CMH1 and the second camera hole CMH2 corresponding to the camera device 720 are not limited to the exemplary embodiment shown in FIG. 2.

Figure 3:
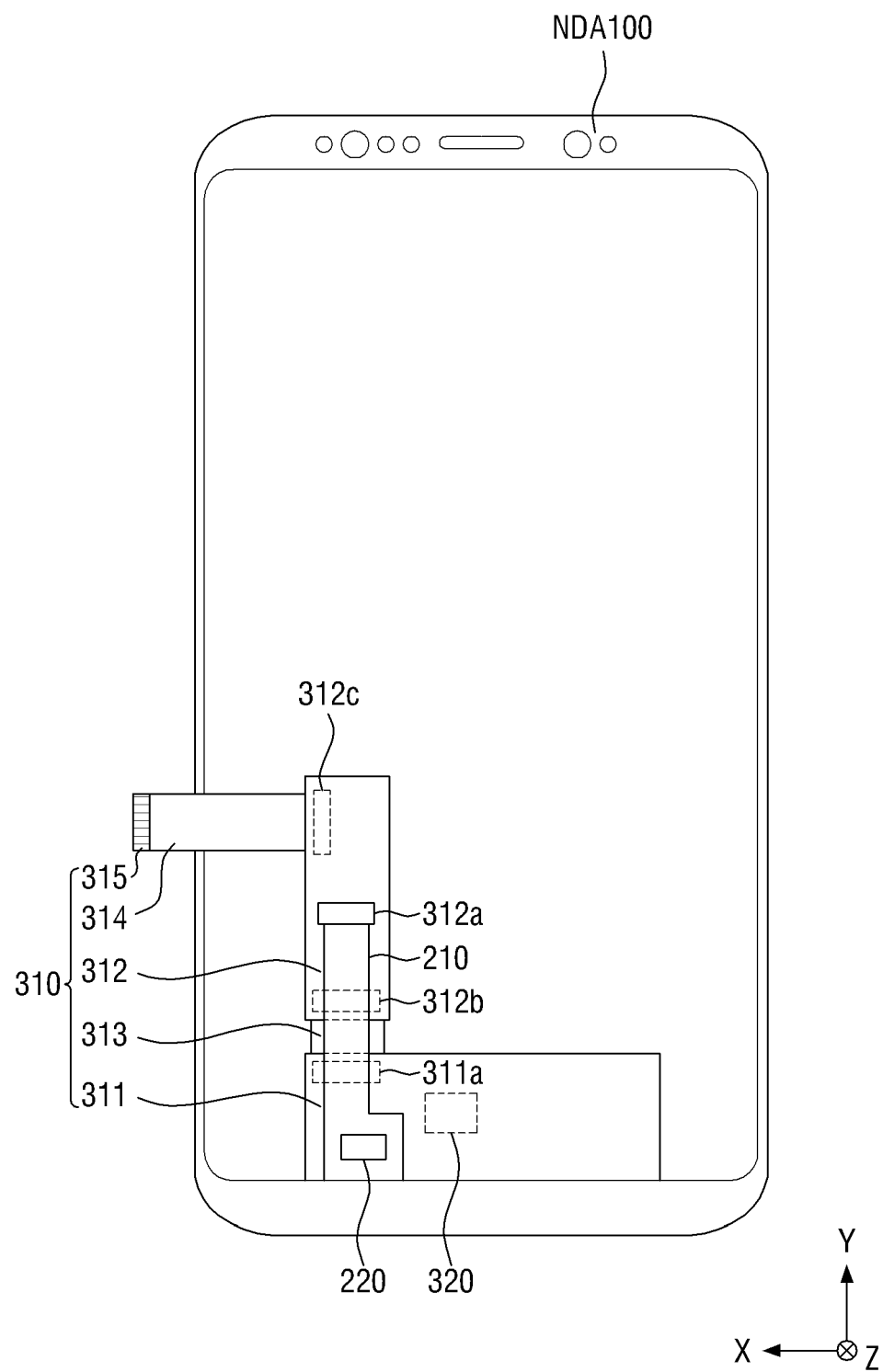
FIG. 3 is a bottom view illustrating examples of a cover window, a touch circuit board, a display circuit board, and a panel lower member of FIG. 2.
Figure 4:
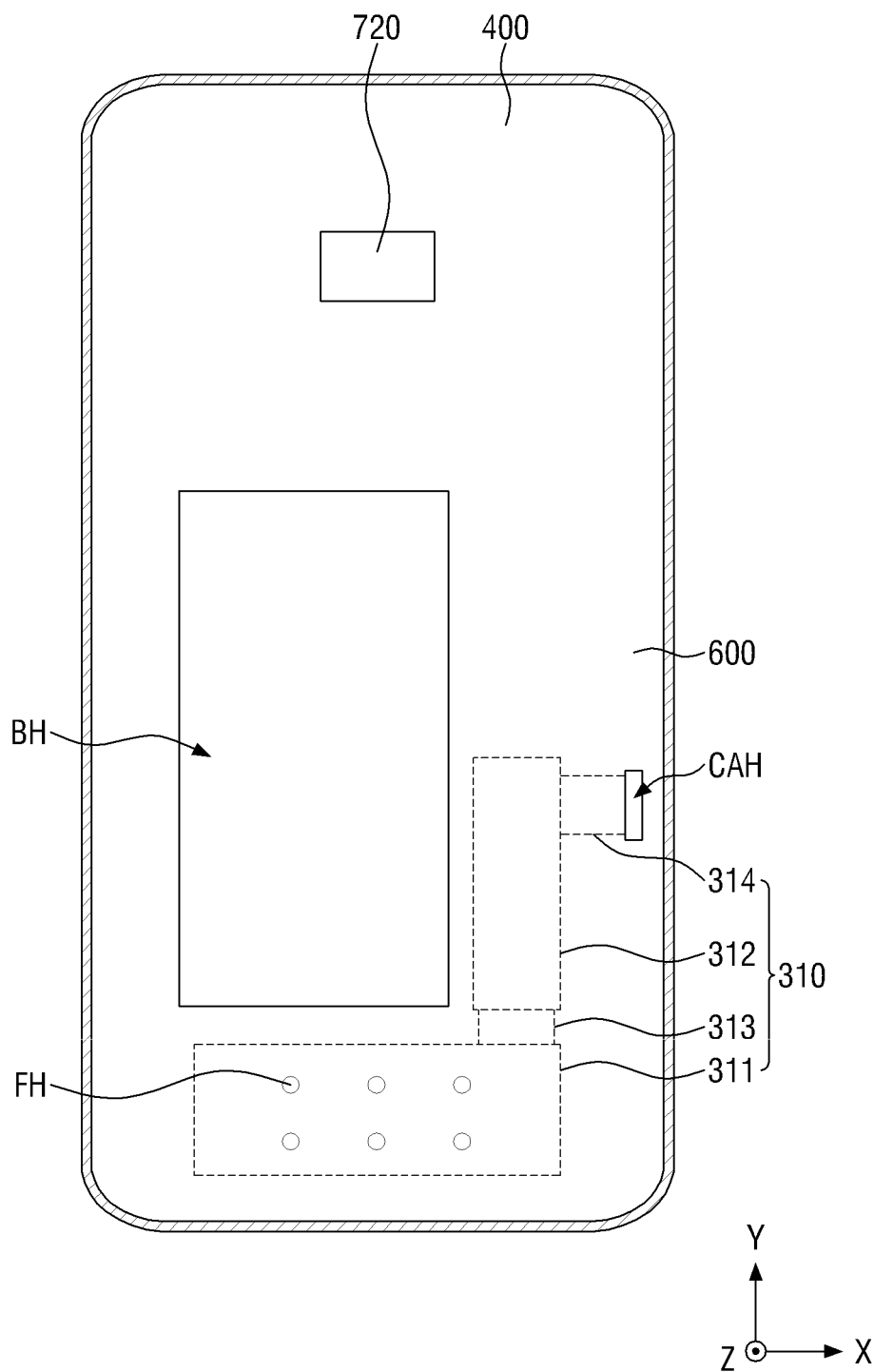
FIG. 4 is a plan view illustrating examples of the display circuit board, a second connection cable, and a middle frame of FIG. 2.
Figure 5:
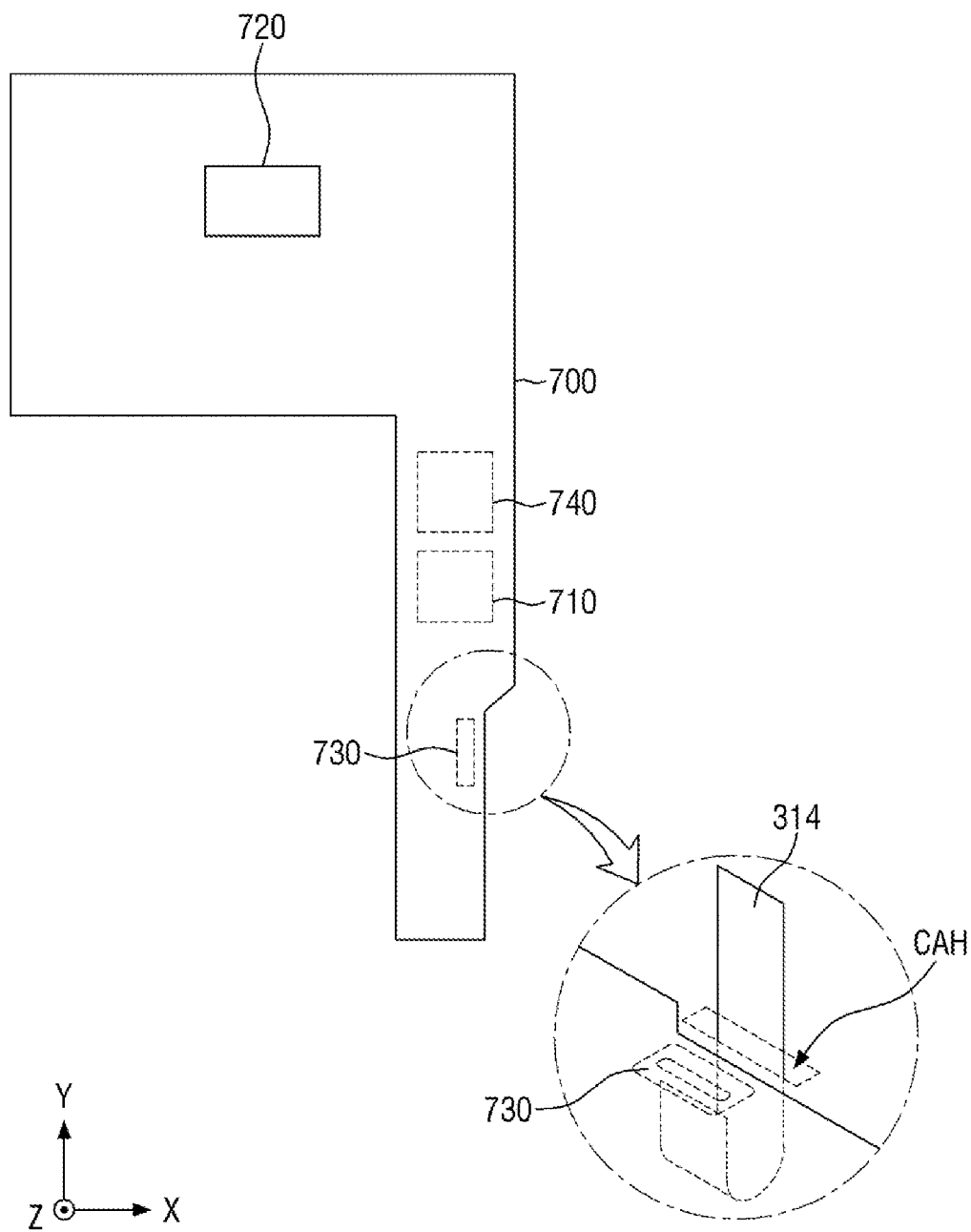
FIG. 5 is a plan view illustrating examples of the second connection cable and a main circuit board of FIG. 2.

FIG. 3 is a bottom view illustrating examples of the cover window, the touch circuit board, the display circuit board, and the panel lower member of FIG. 2. FIG. 4 is a plan view illustrating examples of the display circuit board, the second connection cable, and the middle frame of FIG. 2. FIG. 5 is a plan view illustrating an example of the second connection cable of FIG. 2. Since FIGS. 4 and 5 are plan views and FIG. 3 is a bottom view, it should be noted that the left and right of the display device 10 of FIGS. 4 and 5 are reversed in FIG. 3.

Hereinafter, a manner in which the second connection cable 314 coupled to the display circuit board 310 is coupled to the main connector 730 of the main circuit board 700 will be described in more detail with reference to FIGS. 3 to 5.

Referring to FIGS. 3 to 5, the display circuit board 310 may include a first circuit board 311, a second circuit board 312, and a first connection cable 313.

The first circuit board 311 may be attached to (e.g., adhered to) a side of the upper surface or the lower surface of the substrate of the display panel 300 and may be bent toward the lower surface of the substrate of the display panel 300. As shown in FIG. 4, the first circuit board 311 may be fixed to fixing holes FH formed in the middle frame 600 through fixing members.

The first circuit board 311 may include the display driver 320 and a first connector 311a. The display driver 320 and the first connector 311a may be on a surface of the first circuit board 311.

The first connector 311a may be coupled to an end of the first connection cable 313 coupled to the second circuit board 312. Accordingly, the display driver 320 mounted on the first circuit board 311 may be electrically coupled to the second circuit board 312 through the first connection cable 313.

The second circuit board 312 may include the touch connector 312a, a first connection connector 312b, and a second connection connector 312c. The first connection connector 312b and the second connection connector 312c may be on a surface of the second circuit board 312, and the touch connector 312a may be on the other surface of the second circuit board 312.

The touch connector 312a may be coupled to the touch connection portion provided at the other end of the touch circuit board 210. Accordingly, the touch driver 220 may be electrically coupled to the second circuit board 312.

The first connection connector 312b may be coupled to the other end of the first connection cable 313 coupled to the first circuit board 311. Thus, the display driver 320 mounted on the first circuit board 311 may be electrically coupled to the second circuit board 312 through the first connection cable 313.

The second connection connector 312c may be coupled to an end of the second connection cable 314 coupled to the main connector 730 of the main circuit board 700. Thus, the second circuit board 312 may be electrically coupled to the main circuit board 700 through the second connection cable 314.

A connector connection portion 315 may be formed at the other end of the second connection cable 314. As shown in FIG. 4, the connector connection portion 315 of the second connection cable 314 may pass though the through-hole CAH of the middle frame 600 and extend to the lower portion of the middle frame 600. In addition, as shown in FIG. 5, the connector connection portion 315 of the second connection cable 314, which passes through the through-hole CAH, may pass through a gap between the middle frame 600 and the main circuit board 700 and may extend to a lower portion of the main circuit board 700. Finally, as shown in FIG. 5, the connector connection portion 315 of the second connection cable 314 may be coupled to the main connector 730 on the lower surface of the main circuit board 700.

According to an exemplary embodiment shown in FIGS. 3 to 5, the second connection cable 314 coupled to the display circuit board 310 may extend to the lower portion of the middle frame 600 through the through-hole CAH of the middle frame 600 and thus may be coupled to the main connector 730 of the main circuit board 700. Therefore, the display circuit board 310 and the main circuit board 700 may be stably coupled.

Figure 6:
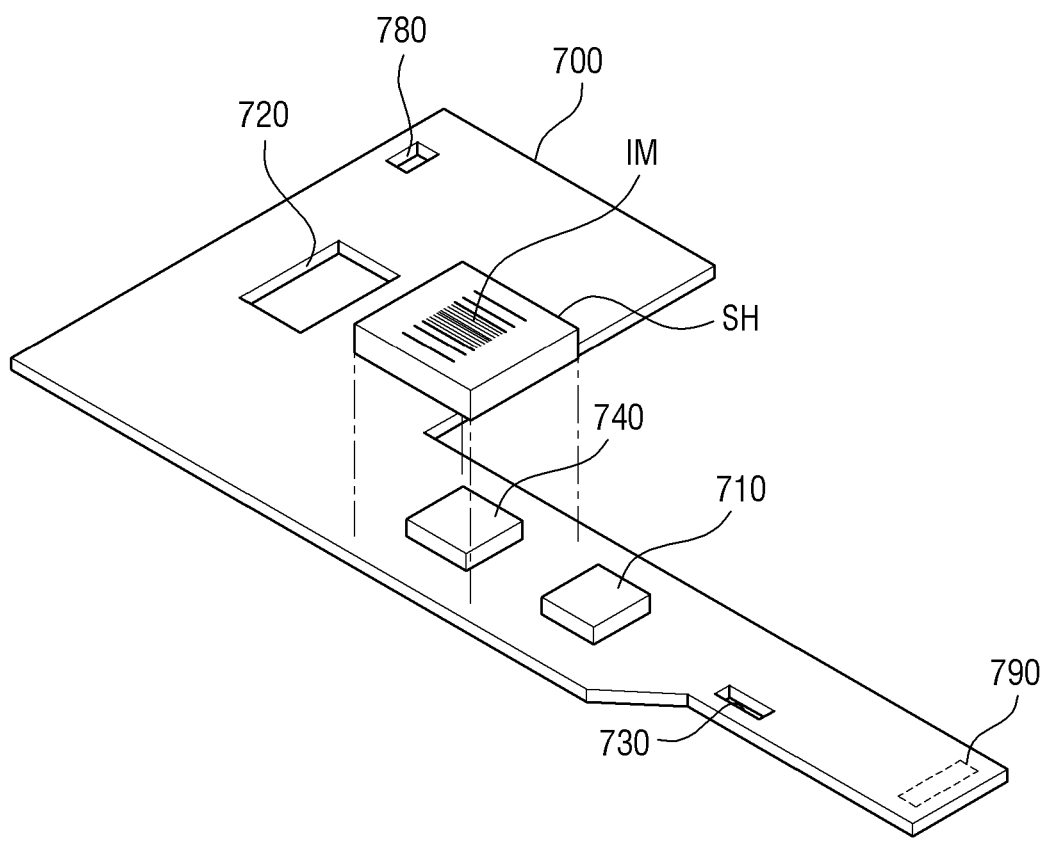
FIG. 6 is a plan view illustrating an example of a shield can on the main circuit board.

FIG. 6 is a plan view illustrating an example of the shield can on the main circuit board. Referring to FIG. 6, the shield can SH may cover the PMIC 740. At least one shield can SH may be on the main circuit board 700 and may transfer heat generated from the PMIC 740 to the heat dissipation member or shield an electromagnetic wave generated from the main processor 710. According to an exemplary embodiment, the shield can SH may transfer the heat generated from the PMIC 740 to the heat dissipation member or shield the electromagnetic wave generated from the main processor 710 by covering an outer side of the PMIC 740 in the form of a can or a box using a metal plate or a synthetic resin to which conductive metals are added. According to an exemplary embodiment, the shield can SH may be provided in the form of a box with a lower portion which is open so as to cover the PMIC 740.

Figure 10:
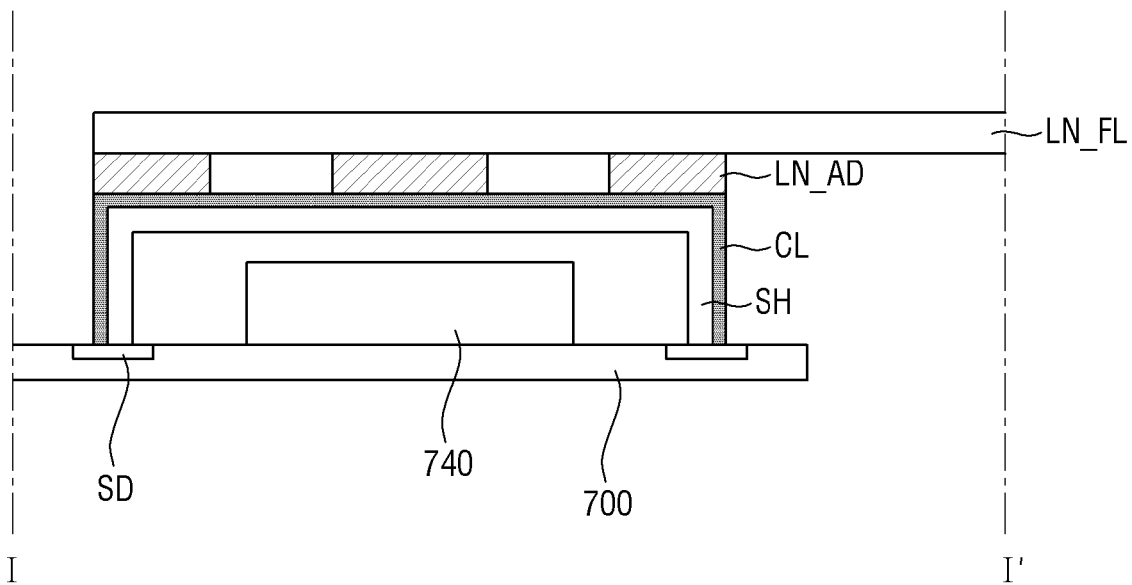
FIG. 10 is a cross-sectional view of the main circuit board, which is taken along line I-I' of FIG. 7 according to the exemplary embodiment.

As shown in FIG. 10, the shield can SH may be soldered and coupled to the main circuit board 700. For example, the main circuit board 700 may include a solder portion SD, and the solder portion SD may electrically couple the shield can SH and the main circuit board 700. According to an exemplary embodiment, the shield can SH may include a conductive shielding layer CL. The conductive shielding layer CL may be made of a metal such as copper. For example, the conductive shielding layer CL may have a shape of a metal film made of a copper material. According to an exemplary embodiment, the conductive shielding layer CL may be composed of a tape made of a copper material. The conductive shielding layer CL may shield an electromagnetic wave generated from the PMIC 740.

Referring again to FIG. 6, an information marking IM including information on the PMIC 740 may be marked on an upper surface of the shield can SH. The information marking IM may include pieces of information on a product name, a model name, a manufacturer name, a serial number (S/N), a part number (P/N), a firmware number, an interface method, and/or an operation condition. The information marking IM may be, for example, at least one selected from a numeral, a character, a numeral and unit, a bar code, and a quick response (QR) code which include the information on the operation condition. In some exemplary embodiments, the information marking IM may further include a symbol and/or a figure. For example, the information marking IM may be formed through a screen printing method, an imprint method, a roll offset printing method, and/or a laser marking method and/or may be formed by filling a groove formed through the laser marking method with ink and/or paint.

Hereinafter, a liner according to an exemplary embodiment will be described.

Figure 7:
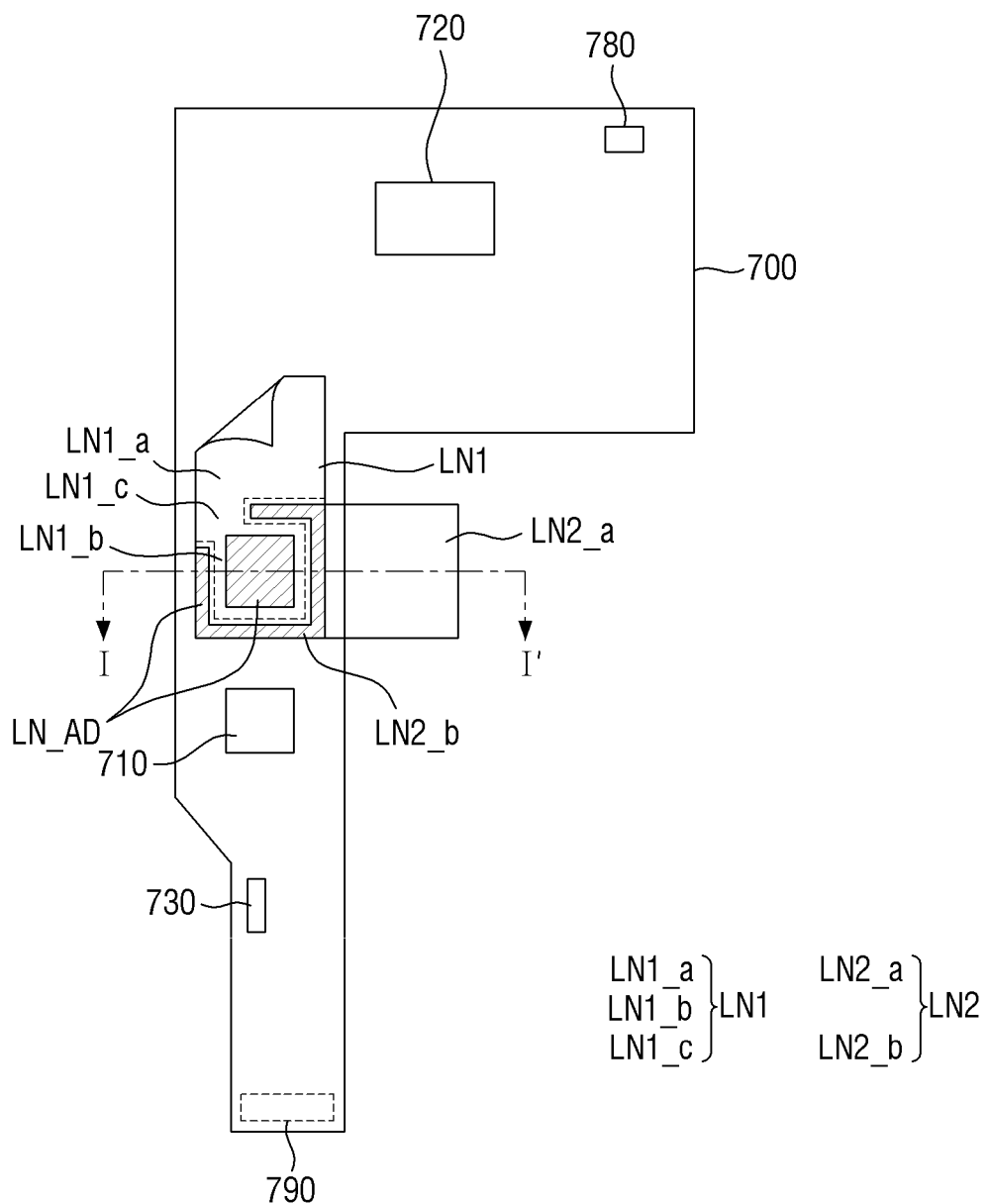
FIG. 7 is a plan view illustrating a liner attached on a shield can according to the exemplary embodiment.
Figure 8:
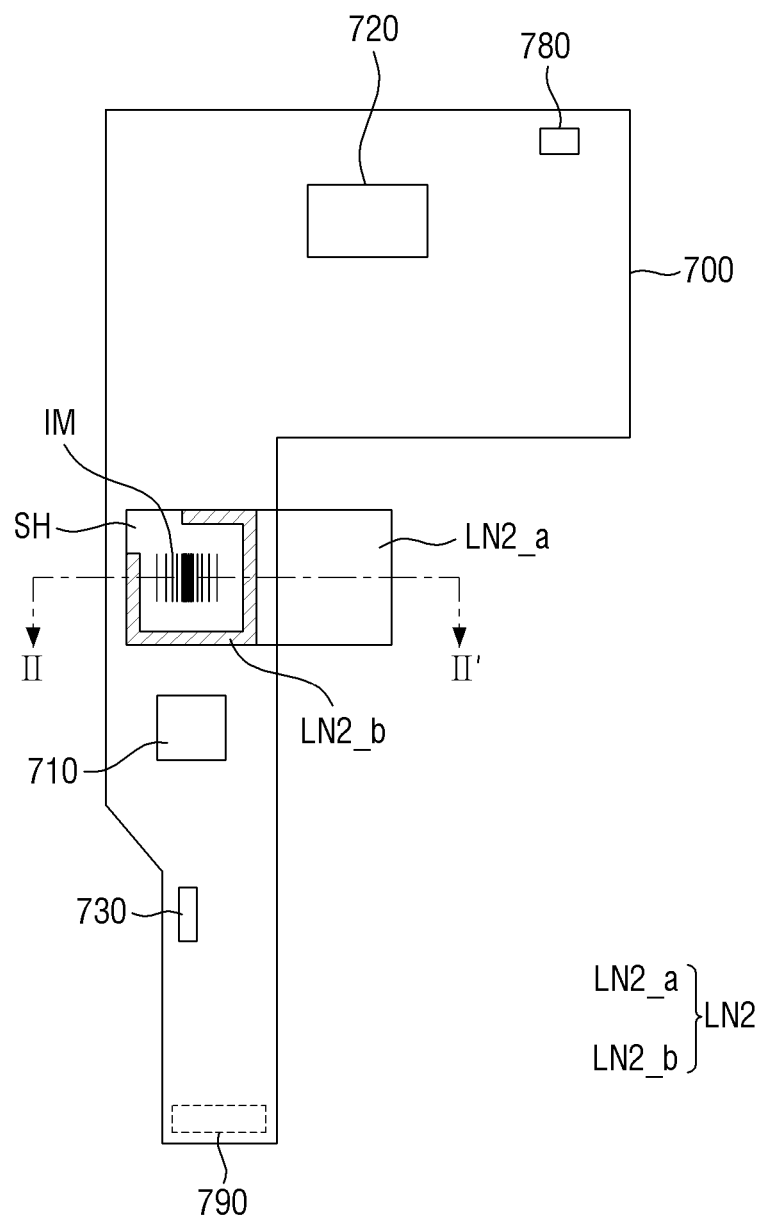
FIG. 8 is a plan view illustrating a state in which a first liner is removed and only a second liner is attached on the shield can according to the exemplary embodiment.
Figure 9:
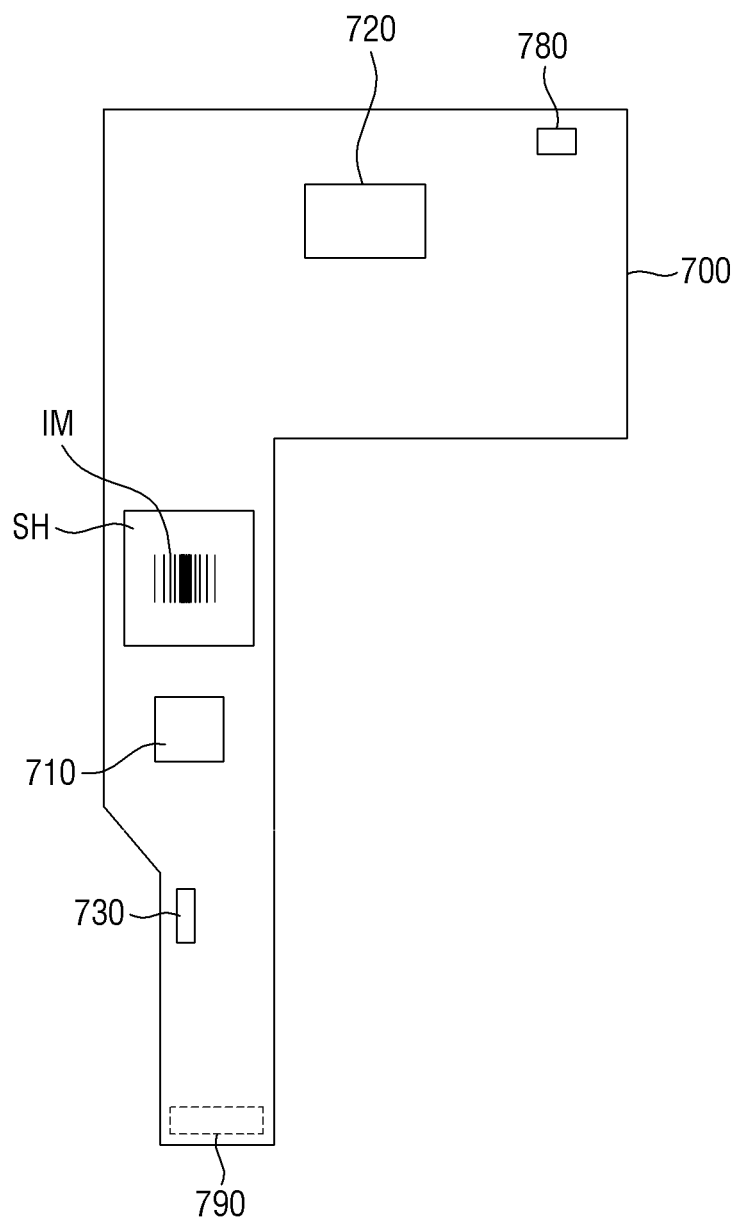
FIG. 9 is a plan view illustrating a state in which the liner is removed from the shield can according to the exemplary embodiment.

FIG. 7 is a plan view illustrating a liner attached on (e.g., adhered on) a shield can. FIG. 8 is a plan view illustrating a state in which a first liner is removed and only a second liner is attached on (e.g., adhered on) the shield can. FIG. 9 is a plan view illustrating a state in which the liner is removed from the shield can.

Referring to FIGS. 7 to 9, a liner LN may be attached on (e.g., adhered on) the shield can SH to prevent or reduce scratching or crushing of the shield can SH by an external force.

The liner LN may be on a surface of the shield can SH. When a display panel is transported and loaded, the liner LN is attached on (e.g., adhered on) a side of the shield can SH to protect the shield can SH, but when the display panel is mounted on a component or the like of an electronic device, the liner LN is peeled off and removed. On the other hand, the above-described information marking IM including the information on the PMIC 740 may be marked in a region of the liner LN. Therefore, even before the liner LN is removed from the shield can SH, the information on the PMIC 740 may be easily confirmed.

An overall shape of a top view of the liner LN may be an "L" shape. For example, the liner LN may be a film in which a first liner LN1 and a second liner LN2 are integrally formed, wherein the first liner LN1 has a width equal to a lateral length of the shield can SH and extends to an upper side of the shield can SH and the second liner LN2 has a width equal to a vertical length of the shield can SH and extends to a right side of the shield can SH. A perforated line may be formed in a boundary region between the first liner LN1 and the second liner LN2 such that the first liner LN1 and the second liner LN2 are easily separated. Here, the perforated line may be formed by punching (e.g., by puncturing such as, for example, by forming a plurality of openings in) a film layer LN_FL to be described below so as to be partially perforated along a corresponding position or may be formed by punching (e.g., by puncturing such as, for example, by forming a plurality of openings in) the film layer LN_FL and an adhesive layer LN_AD to be described below so as to be partially perforated along the corresponding position. The first liner LN1 may include a first grip portion LN1_a configured to facilitate removal of a film, a first shield can protection portion LN1_b configured to protect a surface of a central region of the shield can SH, and a connection portion LN1_c configured to couple the first grip portion LN1_a and the first shield can protection portion.

According to an exemplary embodiment, the above-described information marking IM including the information on the PMIC 740 may be marked on the first shield can protection portion LN1_b. The first shield can protection portion LN1_b may have a rectangular shape which is the same (e.g., substantially the same) as a shape of the shield can SH and of which an area is reduced at the same (e.g., substantially the same) ratio. However, the present disclosure is not limited thereto, and the first shield can protection portion LN1_b may have a polygonal or circular shape as long as the polygonal or circular shape has an area capable of covering a region in which the information marking IM including the information on the PMIC 740 is marked.

The first grip portion LN1_a may have a rectangular shape which has a width equal to the lateral length of the shield can SH and extends to the upper side of the shield can SH. However, the present disclosure is not limited thereto, and the first grip portion LN1_a may be formed in various suitable shapes and forms such that an operator may easily remove the first liner LN1. For example, the width of the first grip portion LN1_a may be equal to a width of the connection portion LN1_c.

The connection portion LN1_c allows the operator to remove the first shield can protection portion LN1_b and the first grip portion LN1_a at once when removing the first liner LN1. According to an exemplary embodiment, the operator may try to peel off the first liner LN1 toward a right lower end while holding a left upper end of the first grip portion LN1_a. Accordingly, the connection portion LN1_c may be formed to overlap a corner positioned at a left upper end of the shield can SH.

After the first liner LN1 is removed, the information marking IM including the information on the PMIC 740 may be marked on a surface of the shield can SH. Thus, even after the first liner LN1 is removed from the shield can SH, the information on the PMIC 740 may be confirmed.

The second liner LN2 may include a second grip portion LN2_a configured to facilitate removal of a film and a second shield can protection portion LN2_b configured to protect a surface of an edge region of the shield can SH.

The second grip portion LN2_a may have a rectangular shape which has a width equal to the vertical length of the shield can SH and extends to the right side of the shield can SH. However, the present disclosure is not limited thereto, and the second grip portion LN2_a may be formed in various suitable shapes and forms such that the operator may easily remove the second liner LN2. For example, the width of the second grip portion LN2_a may be equal to a width of the second shield can protection portion LN2_b.

The second shield can protection portion LN2_b may have a rectangular band shape which is formed along the edge region of the shield can SH so as to have a constant width. In some embodiments, the second liner LN2 may be a region which remains after the first liner LN1 is removed from the liner LN which is integrally formed in an "L" shape. The second shield can protection portion LN2_b may protect a surface of the shield can SH and the information marking IM including the information on the PMIC 740, which is marked on the upper surface of the shield can SH.

Figure 11:
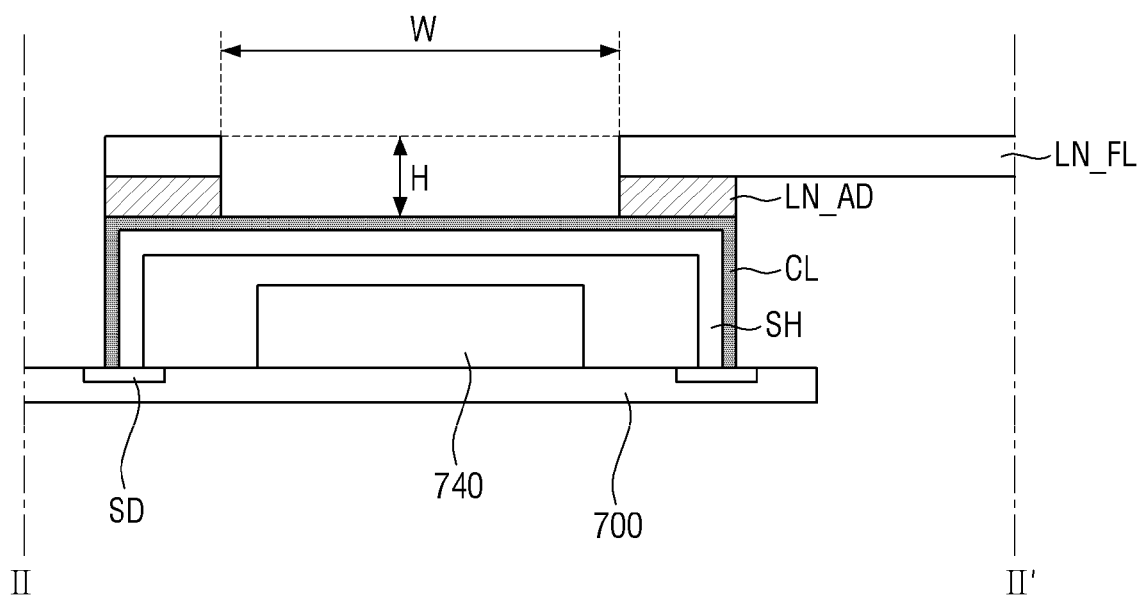
FIG. 11 is a cross-sectional view of the main circuit board, which is taken along line II-II' of FIG. 8 according to the exemplary embodiment.

FIG. 10 is a cross-sectional view of the main circuit board, which is taken along line I-I' of FIG. 7 according to the exemplary embodiment. FIG. 11 is a cross-sectional view of the main circuit board, which is taken along line II-II' of FIG. 8 according to the exemplary embodiment.

Referring to FIGS. 7 to 11, the liner LN may include the film layer LN_FL and the adhesive layer LN_AD. The film layer LN_FL may include a region that overlaps the shield can SH and protects the shield can SH and a grip region configured to facilitate removal of the liner LN from the shield can SH.

The film layer LN-FL may be made of at least one selected from among PET, polyurethane (PU), PI, PC, polyethylene (PE), polypropylene (PP), polysulfone (PSF), polymethylmethacrylate (PMMA), triacetyl cellulose (TAC), a cycloolefin polymer (COP), and the like.

A bending degree (bending strength) of the film layer LN_FL may be changed according to the type (or composition) and/or thickness of the above-described materials. The film layer LN_FL of the liner LN may have a bending strength greater than or equal to a set or certain reference so as to protect the shield can SH. A curvature of a bent portion of the film layer LN_FL may vary according to the bending strength. In some exemplary embodiments, as the bending strength of the film layer LN_FL is increased, the curvature of the bent portion may be increased. As the curvature of the bent portion is increased, a repulsive force due to the bent portion is dispersed so that pressure applied to the shield can SH may be reduced.

The adhesive layer LN_AD is on the other surface of the film layer LN_FL and couples (attaches) the film layer LN_FL to a surface of the shield can SH. In some embodiments, the film layer LN_FL is attached to (e.g., adhered to) a surface of the shield can SH through the adhesive layer LN_AD. For example, in the first liner LN1, the adhesive layer LN_AD may be only in a partial region of the first shield can protection portion. In some embodiments, the adhesive layer LN_AD may not be on the grip portion and the connection portion. On the other hand, in the second liner LN2, the adhesive layer LN_AD may be in an entire region of the second shield can protection portion. For example, the adhesive layer LN_AD may be in the entire region excluding the grip portion.

An adhesive force or bonding force of the adhesive layer LN_AD to the shield can SH may be suitable or sufficient as long as the film layer LN_FL may be attached to (e.g., adhered to) the shield can SH without being detached therefrom at the time of storage or transportation. When the liner LN is peeled off, the adhesive layer LN_AD may be separated from the shield can SH in a state of being attached to (e.g., adhered to) the film layer LN_FL and may not remain on the surface of the shield can SH. From this perspective, the bonding force of the adhesive layer LN_AD to the shield can SH may be less than a bonding force of the adhesive layer LN_AD to the film layer LN_FL.

The adhesive layer LN_AD may be formed as a low adhesive layer. For example, the adhesive layer LN_AD may include an acrylic-based adhesive material, a urethane-based adhesive material, and/or a silicon-based adhesive material.

Referring to FIG. 11, even after the first liner LN1 is removed from the shield can SH, due to the second liner LN2 remaining on a portion of the upper surface of the shield can SH, an interval may be formed by a distance H from the upper surface of the shield can SH to an upper surface of the second liner LN2. During transporting and/or working processes of a display module, a side of the display module may be scratched or crushed by an external factor. According to an exemplary embodiment, when a space is secured by the distance H from the upper surface of the shield can SH to the upper surface of the second liner LN2, it is possible to reduce a probability that the upper surface of the shield can SH and the information marking IM including the information on the PMIC 740 marked on the upper surface of the shield can SH are scratched and/or crushed by the external factor.

Hereinafter, another exemplary embodiment of a display panel will be described. In the following exemplary embodiments, duplicative descriptions of the same components as those of the previously described embodiments will not be repeated here, and differences will be mainly described.

Figure 12:
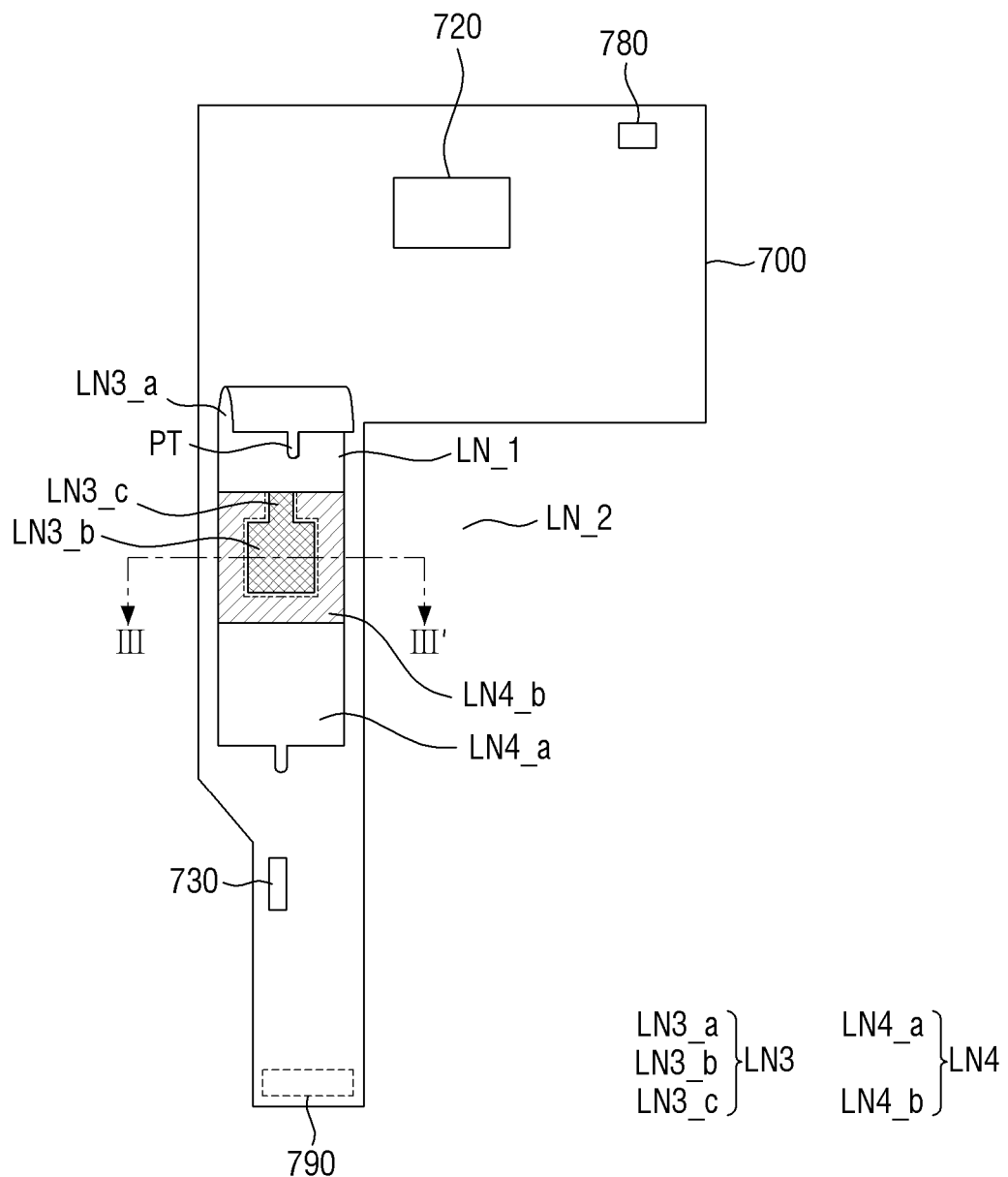
FIG. 12 is a plan view illustrating a liner attached on a shield can according to another exemplary embodiment.
Figure 13:
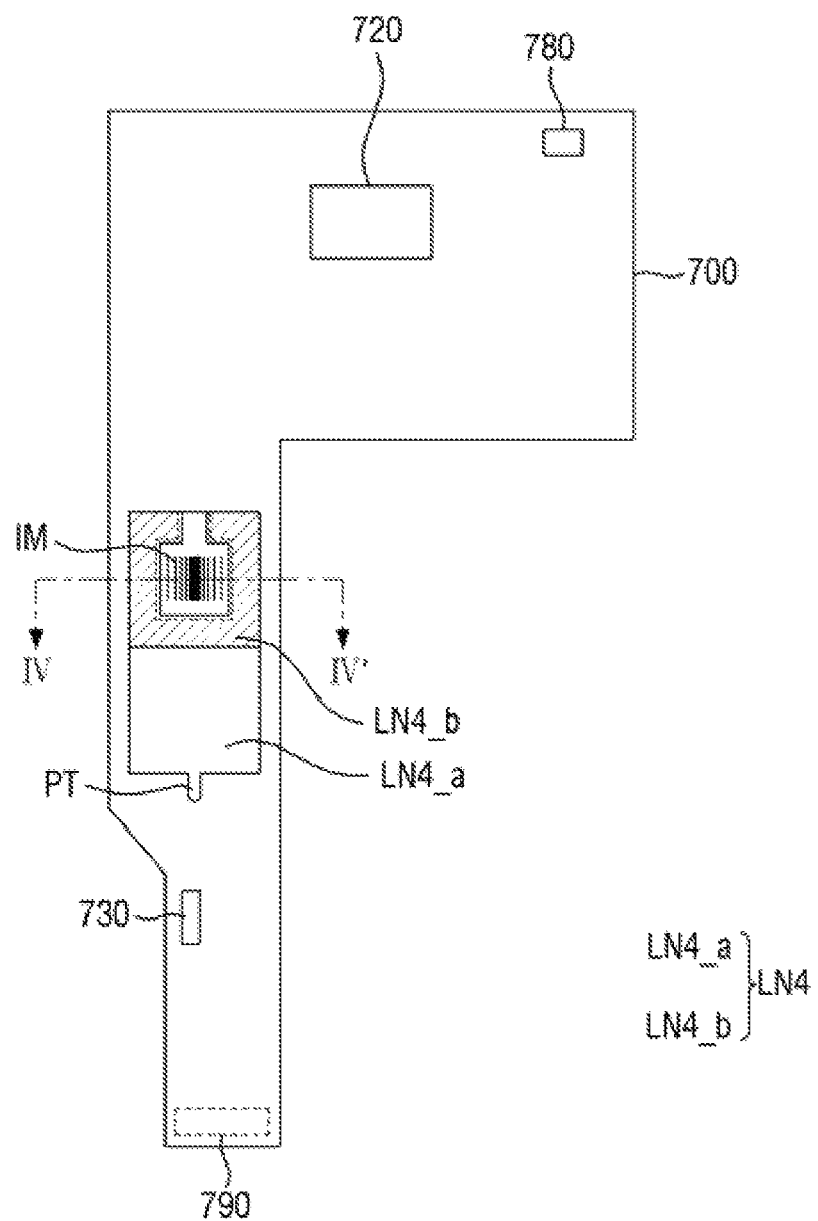
FIG. 13 is a plan view illustrating a state in which a first liner is removed and only a second liner is attached on the shield can according to another exemplary embodiment.
Figure 14:
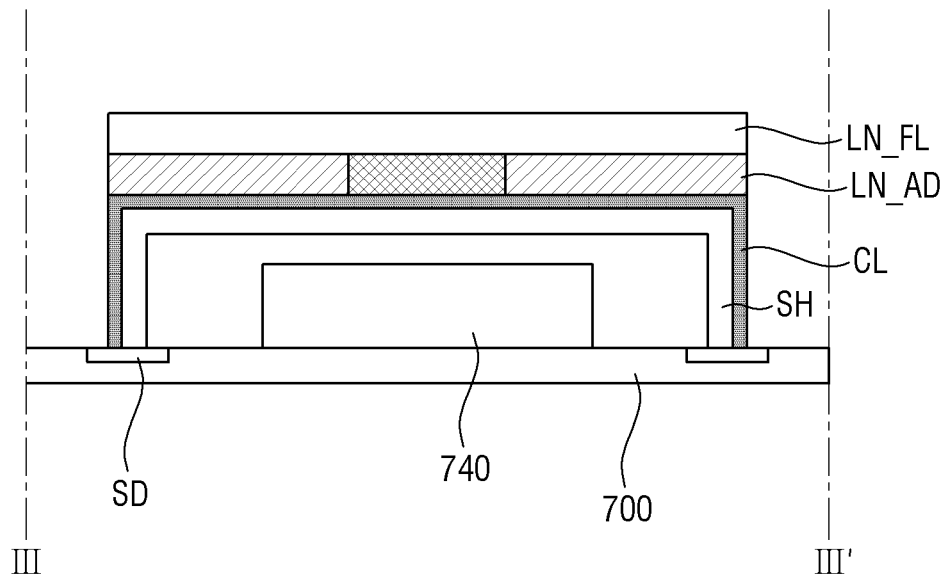
FIG. 14 is a cross-sectional view of a main circuit board, which is taken along line III-III' of FIG. 12 according to another exemplary embodiment.
Figure 15:
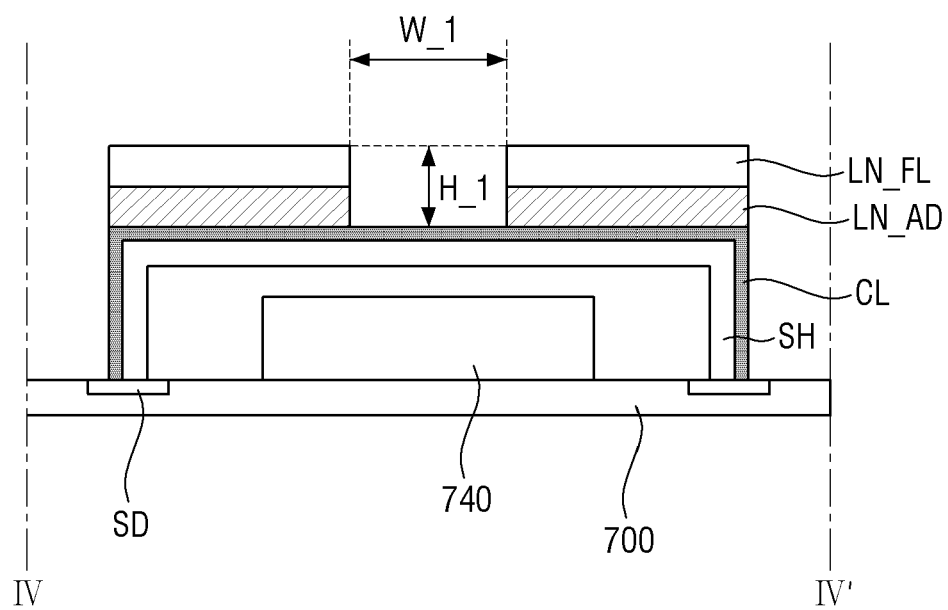
FIG. 15 is a cross-sectional view of the main circuit board, which is taken along line IV-IV' of FIG. 13 according to another exemplary embodiment.

FIG. 12 is a plan view illustrating a liner attached on (e.g., adhered on) a shield can according to another exemplary embodiment. FIG. 13 is a plan view illustrating a state in which a first liner is removed and only a second liner is attached on (e.g., adhered on) the shield can according to another exemplary embodiment. FIG. 14 is a cross-sectional view of a main circuit board, which is taken along line III-III' of FIG. 12 according to another exemplary embodiment. FIG. 15 is a cross-sectional view of the main circuit board, which is taken along line IV-IV' of FIG. 13 according to another exemplary embodiment.

Referring to FIGS. 12 to 15, the liner according to the present exemplary embodiment is different from that shown in the exemplary embodiment of FIGS. 7 and 8 in that the liner has an "1" shape (e.g., a straight rectangular shape) and further includes a pull tab portion on a grip portion, and an adhesive layer is in an entire region of a first shield can protection portion and an entire region of a second shield protection portion.

In some embodiments, an overall shape of a top view of the liner LN may be the "1" shape. For example, the liner LN may be a film in which a first liner LN3 and a second liner LN4 are integrally formed, wherein the first liner LN3 has a width equal to a lateral length of a shield can SH and extends to an upper side of the shield can SH and the second liner LN4 has a width equal to a vertical of the shield can SH and extends to a lower side of the shield can SH. A perforated line may be formed in a boundary region between the first liner LN3 and the second liner LN4 such that the first liner LN3 and the second liner LN4 are easily separated. Here, the perforated line may be formed by punching (e.g., by puncturing such as, for example, by forming a plurality of openings in) a film layer LN_FL so as to be partially perforated along a corresponding position or may be formed by punching (e.g., by puncturing such as, for example, by forming a plurality of openings in) the film layer LN_FL and an adhesive layer LN_AD so as to be partially perforated along the corresponding position.

The first liner LN3 may include a first grip portion LN3_a configured to facilitate removal of a film, a first shield can protection portion LN3_b configured to protect a surface of a central region of the shield can SH, and a connection portion LN3_c configured to couple the first grip portion LN3_a and the first shield can protection portion LN3_b.

According to an exemplary embodiment, the above-described information marking IM including the information on the PMIC 740 may be marked on the first shield can protection portion. The first shield can protection portion LN3_b may have a rectangular shape which is the same (e.g., substantially the same) as a shape of the shield can SH and of which an area is reduced at the same (e.g., substantially the same) ratio. For example, an area of the first shield can protection portion LN3_b may be equal to an area of a region in which the information marking IM including the information on the PMIC 740 is marked.

The first grip portion LN3_a may have a rectangular shape which has a width equal to a lateral length of the shield can SH and extends to an upper side of the shield can SH. However, the present disclosure is not limited thereto, and the first grip portion LN3_a may be formed in various suitable shapes and forms such that an operator may easily remove the first liner LN3. For example, a width of the first grip portion LN3_a may be equal to a width of the connection portion LN3_c.

At least one pull tab portion PT protruding outward from the first grip portion LN3_a may be positioned in a region of an upper portion of the first grip portion LN3_a. Therefore, when the first liner LN3 and the shield can SH are peeled off, it is easy to grip the grip portion through the pull tab portion PT. Therefore, a process of peeling off the first liner LN3 may be performed rapidly. The pull tab portion PT is illustrated in the drawing as being at a center of an upper end of the first grip portion LN3_a, but the number and position of the pull tab portions PT are not limited.

The connection portion LN3_c allows the operator to remove the first shield can protection portion LN3_b and the first grip portion LN3_a at once when removing the first liner LN3. According to an exemplary embodiment, the operator may try to peel off the first liner LN3 from the center of the upper end to a center of a lower end while holding the pull tab portion of the first grip portion LN3_a. Accordingly, the connection portion LN3_c may be formed to overlap a central region of an upper end of the shield can SH.

After the first liner LN3 is removed, the information marking IM including the information on the PMIC 740 may be marked on a surface of the shield can SH. Thus, even after the first liner LN3 is removed from the shield can SH, the information on the PMIC 740 may be confirmed.

The second liner LN4 may include a second grip portion LN4_$a$ configured to facilitate removal of a film and a second shield can protection portion LN4_$b$ configured to protect a surface of an edge region of the shield can SH.

The second grip portion LN4_$a$ may have a rectangular shape which has a width equal to the lateral length of the shield can SH and extends to a lower side of the shield can SH. However, the present disclosure is not limited thereto, and the second grip portion LN4_$a$ may be formed in various suitable shapes and forms such that the operator easily removes the second liner LN4. For example, the width of the second grip portion LN4_$a$ may be equal to a width of the second shield can protection portion LN4_$b$.

At least one pull tab portion PT protruding outward from the second grip portion LN4_$a$ may be positioned in a region of a lower end of the second grip portion LN4_$a$. Therefore, when the second liner LN4 and the shield can SH are peeled off, it is easy to grip the second grip portion LN4_$a$ through the pull tab portion PT. Therefore, a process of peeling off the second liner LN4 may be rapidly performed. The pull tab portion PT is illustrated in the drawing as being at a center of the lower end of the second grip portion LN4_$a$, but the number and position of the pull tab portions PT are not limited thereto. According to an exemplary embodiment, the operator may try to peel off the second liner LN4 from the center of the lower end to a center of an upper end while holding the pull tab portion of the second grip portion LN4_$a$.

The second shield can protection portion LN4_$b$ may have a rectangular band shape which is formed along the edge region of the shield can SH so as to have a constant width. In some embodiments, the second liner LN4 may be a region which remains after the first liner LN3 is removed from the liner LN which has a "1" shape. The second shield can protection portion LN4_$b$ may protect a surface of the shield can SH and the information marking IM including the information on the PMIC 740, which is marked on an upper surface of the shield can SH.

FIG. 14 is a cross-sectional view of the main circuit board, which is taken along line III-III' of FIG. 12 according to the exemplary embodiment. FIG. 15 is a cross-sectional view of the main circuit board, which is taken along line IV-IV' of FIG. 13 according to the exemplary embodiment.

Referring to FIGS. 12 to 15, the liner LN may include the film layer LN_FL and the adhesive layer LN_AD. The film layer LN_FL may include a region that overlaps the shield can SH and protects the shield can SH and a grip region configured to facilitate removal of the liner LN from the shield can SH.

The film layer LN-FL may be made of at least one selected from among PET, PU, PI, PC, PE, PP, PSF, PMMA, TAC, COP, and the like.

A bending degree (bending strength) of the film layer LN_FL may be changed according to the type (or composition) and/or thickness of the above-described materials. The film layer LN_FL of the liner LN may have a bending strength greater than or equal to a certain reference so as to protect the shield can SH. A curvature of a bent portion of the film layer LN_FL may vary according to the bending strength. In some exemplary embodiments, as the bending strength of the film layer LN_FL is increased, the curvature of the bent portion may be increased. As the curvature of the bent portion is increased, a repulsive force due to the bent portion is dispersed so that pressure applied to the shield can SH may be reduced.

The adhesive layer LN_AD is on the other surface of the film layer LN_FL and couples (attaches) the film layer LN_FL to a surface of the shield can SH. In some embodiments, the film layer LN_FL is attached to (e.g., adhered to) a surface of the shield can SH through the adhesive layer LN_AD. For example, in the first liner LN3, the adhesive layer LN_AD may be in an entire region of each of the first shield can protection portion LN3-$b$ and the connection portion LN3_$c$. In some embodiments, the adhesive layer LN_AD may not be on the first grip portion LN3_$a$. In some embodiments, in the second liner LN4, the adhesive layer LN_AD may be in an entire region of the second shield can protection portion LN4_$b$. For example, the adhesive layer LN_AD may be in an entire region excluding the second grip portion LN4_$a$.

An adhesive force or bonding force of the adhesive layer LN_AD to the shield can SH may be suitable or sufficient as long as the film layer LN_FL may be attached to (e.g., adhered to) the shield can SH without being detached therefrom at the time of storage or transportation. When the liner LN is peeled off, the adhesive layer LN_AD may be separated from the shield can SH in a state of being attached to (e.g., adhered to) the film layer LN_FL and may not remain on the surface of the shield can SH. From this respect, the bonding force of the adhesive layer LN_AD to the shield can SH may be less than a bonding force of the adhesive layer LN_AD to the film layer LN_FL.

The adhesive layer LN_AD may be formed as a low adhesive layer. For example, the adhesive layer LN_AD may include an acrylic-based adhesive material, a urethane-based adhesive material, and/or a silicon-based adhesive material.

Referring to FIG. 15, even after the first liner LN3 is removed from the shield can SH, due to the second liner LN4 remaining on a portion of the upper surface of the shield can SH, an interval may be formed by a distance H from the upper surface of the shield can SH to an upper surface of the second liner LN4. As shown in FIG. 15, an interval may be formed to have a distance H_1 from an upper surface of the conductive shielding layer CL to an upper surface of the film layer LN_FL. In addition, according to the present exemplary embodiment, because an area of the first liner LN3 is equal to an area of the information marking IM including the information on the PMIC 740, a width W_1 of the first liner LN3 may be less than a width W of the first liner LN1 shown in FIG. 11. In such a case, because an area of the second liner LN4 remaining on the upper surface of the shield can SH is greater than an area of the second liner LN2 shown in FIG. 11, it is possible to further reduce a probability that the upper surface of the shield can SH and the information marking IM including the information on the PMIC 740 marked on the upper surface of the shield can SH are scratched and/or crushed by the external factor.

Hereinafter, a method of manufacturing a display device will be described.

Figure 16:
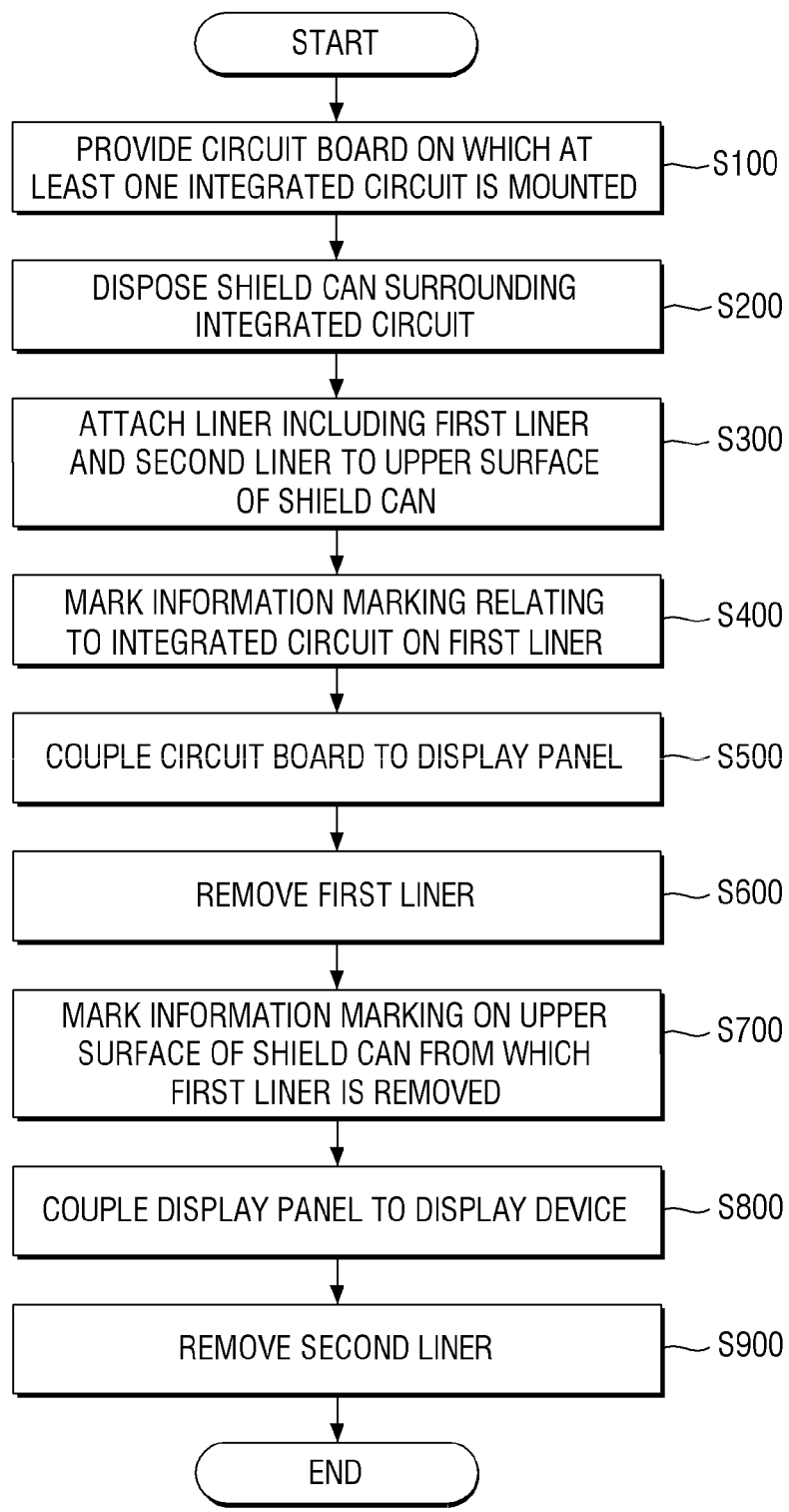
FIG. 16 is a flowchart of a method of manufacturing a display device including a liner according to an exemplary embodiment.

FIG. 16 is a flowchart of a method of manufacturing a display device including a liner according to an exemplary embodiment.

First, a printed circuit board, on which at least one IC is mounted, is provided (S100). Referring to FIGS. 2, 7, and 16, the main circuit board 700 may include the main processor 710, the camera device 720, the main connector 730, the PMIC 740, the first microphone 780, and the first auxiliary connector 790.

A shield can surrounding (e.g., at least partially surrounding) the IC is provided (S200). Here, the IC may be the PMIC 740. The PMIC 740 may be electrically coupled to the touch circuit board 210, the touch driver 220, the display circuit board 310, the display driver 320, and the main processor 710. The PMIC 740 may control power supplied to the touch circuit board 210, the touch driver 220, the display circuit board 310, the display driver 320, and the main processor 710. The shield can SH may cover the PMIC 740. At least one shield can SH may be on the main circuit board 700 and may transfer heat generated from the PMIC 740 to a heat dissipation member or shield an electromagnetic wave generated from the main processor 710. According to an exemplary embodiment, the shield can SH may transfer the heat generated from the PMIC 740 to the heat dissipation member or shield the electromagnetic wave generated from the main processor 710 by covering outer sides of the PMIC 740 in the form of a can or a box using a metal plate or a synthetic resin to which conductive metals are added.

A liner including a first liner and a second liner is attached to (e.g., adhered to) an upper surface of the shield can (S300).

The liner LN may be on a surface of the shield can SH. An overall shape of a top view of the liner LN may be an "L" shape. For example, the liner LN may be a film in which the first liner LN1 and the second liner LN2 are integrally formed, wherein the first liner LN1 has a width equal to a lateral length of the shield can SH and extends to an upper side of the shield can SH and the second liner LN2 has a width equal to a vertical length of the shield can SH and extends to a right side of the shield can SH. A perforated line may be formed in a boundary region between the first liner LN1 and the second liner LN2 such that the first liner LN1 and the second liner LN2 are easily separated. Here, the perforated line may be formed by punching (e.g., by puncturing such as, for example, by forming a plurality of openings in) a film layer LN_FL to be described below so as to be partially perforated along a corresponding position or may be formed by punching (e.g., by puncturing such as, for example, by forming a plurality of openings in) the film layer LN_FL and an adhesive layer LN_AD to be described below so as to be partially perforated along the corresponding position.

An information marking relating to the IC is marked on the first liner (S400).

The information marking IM including information on the PMIC 740 may be marked on the first shield can protection portion LN1_b. The information marking IM may include pieces of information on a product name, a model name, a manufacturer name, an S/N, a P/N, a firmware number, an interface method, and/or an operation condition. The information marking IM may be, for example, at least one selected from a numeral, a character, a numeral and unit, a bar code, and a QR code which include the information on an operation condition. In some exemplary embodiments, the information marking IM may further include a symbol and/or a figure. For example, the information marking IM may be formed through a screen printing method, an imprint method, a roll offset printing method, and/or a laser marking method and/or may be formed by filling a groove formed through the laser marking method with ink and/or paint.

The printed circuit board is coupled to a display panel (S500). A printed circuit board to which the liner LN is attached may be coupled to the display panel.

Since the liner LN protects a surface of the shield can SH, it is possible to prevent or reduce scratching and/or crushing of the surface of the shield can SH by an external factor (e.g., an external force).

The first liner is removed (S600). A first grip portion LN1_a may have a rectangular shape which has a width equal to the lateral length of the shield can SH and extends to the upper side of the shield can SH. However, the present disclosure is not limited thereto, and the first grip portion LN1_a may be formed in various suitable shapes and forms such that an operator may easily remove the first liner LN1. For example, the width of the first grip portion LN1_a may be equal to a width of a connection portion LN1_c. The connection portion LN1_c allows the operator to remove the first shield can protection portion LN1_b and the first grip portion LN1_a at once when removing the first liner LN1. According to an exemplary embodiment, the operator may try to peel off the first liner LN1 toward a right lower end while holding a left upper end of the first grip portion LN1_a. Accordingly, the connection portion LN1_c may be formed to overlap a corner positioned at a left upper end of the shield can SH.

The information marking is marked on the upper surface of the shield can from which the first liner is removed (S700). After the first liner LN1 is removed, the information marking IM including the information on the PMIC 740 may be marked on a surface of the shield can SH. The information marking IM may include pieces of information on a product name, a model name, a manufacturer name, an S/N, a P/N, a firmware number, an interface method, and/or an operation condition. The information marking IM may be, for example, at least one selected from a numeral, a character, a numeral and unit, a bar code, and a QR code which include the information on the operation condition. In some exemplary embodiments, the information marking IM may further include a symbol and/or a figure. For example, the information marking IM may be formed through a screen printing method, an imprint method, a roll offset printing method, and/or a laser marking method and/or may be formed by filling a groove formed through the laser marking method with ink and/or paint. Thus, even after the first liner LN1 is removed from the shield can SH, the information on the PMIC 740 may be confirmed.

After the display panel is coupled with the display device, the second liner is removed (S800 and S900). The display panel to which the second liner LN2 is attached may be coupled to the display device. Since the second liner LN2 protects the surface of the shield can SH, it is possible to prevent or reduce scratching or crushing of the surface of the shield can SH by an external factor (e.g., an external force). Referring to FIG. 11, when a space is secured with a distance which is as much as the distance H from the upper surface of the shield can SH to the upper surface of the second liner LN2, it is possible to reduce a probability that the upper surface of the shield can SH and the information marking IM including the information on the PMIC 740 marked on the upper surface of the shield can SH are scratched and/or crushed by the external factor.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although certain exemplary embodiments have been described herein, other embodiments and modifications will be apparent from this description. Accordingly, the subject matter of the present disclosure is not limited to such embodiments, but rather to the broader scope of the appended claims, and equivalents thereof.

What is claimed is:

1. A liner comprising:
   a first liner comprising a first shield can protection portion, a first grip portion, and a connection portion coupling the first shield can protection portion to the first grip portion;
   a second liner comprising a second shield can protection portion and a second grip portion; and
   a perforated line formed along a boundary between the first liner and the second shield can protection portion, wherein the first shield can protection portion, the connection portion, and the second shield can protection portion overlap a shield can surrounding at least one integrated circuit, and
   wherein the first grip portion has a width equal to a lateral length of the shield can and extends in a first direction of the shield can.

2. The liner of claim 1, wherein the first shield can protection portion overlaps a central region of the shield can, and the second shield can protection portion overlaps an edge region of the shield can.

3. The liner of claim 1, wherein the first liner and the second liner comprise a film layer and an adhesive layer that attaches the film layer to the shield can.

4. The liner of claim 1, wherein the first shield can protection portion comprises an information marking relating to the integrated circuit.

5. The liner of claim 1, wherein the shield can has a rectangular shape when viewed from above.

6. The liner of claim 3, wherein the first shield can protection portion and the second shield can protection portion comprise the adhesive layer in at least a region of the first shield can protection portion and the second shield can protection portion.

7. The liner of claim 3, wherein the perforated line is formed by punching the film layer so as to be partially perforated along a corresponding position thereof.

8. The liner of claim 3, wherein the perforated line is formed by punching the film layer and the adhesive layer so as to be partially perforated along a corresponding position thereof.

9. The liner of claim 3, wherein a distance from an upper surface of a circuit board, on which the integrated circuit is mounted, to an upper surface of the film layer is greater than a distance from the upper surface of the circuit board to an upper surface of the shield can.

10. The liner of claim 4, wherein the information marking is any one selected from a numeral, a character, a bar code, and a quick response (QR) code.

11. The liner of claim 5, wherein the connection portion is formed to overlap a corner of the shield can.

12. The liner of claim 5, wherein a pull tab portion is further provided at a region of an upper end of the first grip portion and a region of an upper end of the second grip portion.

13. A liner comprising: a first liner comprising a first shield can protection portion, a first grip portion, and a connection portion coupling the first shield can protection portion to the first grip portion; a second liner comprising a second shield can protection portion and a second grip portion; and a perforated line formed along a boundary between the first liner and the second shield can protection portion, wherein the first shield can protection portion, the connection portion, and the second shield can protection portion overlap a shield can surrounding at least one integrated circuit; wherein the shield can has a rectangular shape when viewed from above, and wherein the second grip portion has a width equal to a vertical length of the shield can and extends in a second direction perpendicular to a first direction.

14. A liner comprising: a first liner comprising a first shield can protection portion, a first grip portion, and a connection portion coupling the first shield can protection portion to the first grip portion; a second liner comprising a second shield can protection portion and a second grip portion; and a perforated line formed along a boundary between the first liner and the second shield can protection portion, wherein the first shield can protection portion, the connection portion, and the second shield can protection portion overlap a shield can surrounding at least one integrated circuit; wherein the shield can has a rectangular shape when viewed from above, and wherein the second grip portion has a width equal to a lateral length of the shield can and extends in a third direction opposite to a first direction.

15. A display device comprising:
a circuit board;
an integrated circuit mounted on the circuit board;
a shield can formed to surround the integrated circuit; and
a liner attached to the shield can, the liner being configured to be peeled off,
wherein the liner comprises a first liner comprising a first shield can protection portion, a first grip portion, and a connection portion coupling the first shield can protection portion to the first grip portion;
a second liner comprising a second shield can protection portion and a second grip portion; and
a perforated line formed along a boundary between the first liner and the second shield can protection portion,
wherein the first shield can protection portion, the connection portion, and the second shield can protection portion overlap the shield can surrounding the integrated circuit, and
wherein the first grip portion has a width equal to a lateral length of the shield can and extends in a first direction of the shield can.

\* \* \* \* \*